United States Patent
Kobayashi et al.

(10) Patent No.: US 9,654,113 B2
(45) Date of Patent: May 16, 2017

(54) CONTROL DEVICE FOR CLOCK GENERATION CIRCUIT, CONTROL METHOD FOR CLOCK GENERATION CIRCUIT, AND CLOCK GENERATION CIRCUIT

(71) Applicant: FUJITSU LIMITED, Kawasaki-shi, Kanagawa (JP)

(72) Inventors: Masumi Kobayashi, Kawasaki (JP); Shigeaki Kawamata, Sagamihara (JP); Kenji Kazehaya, Yokohama (JP); Yuichiro Katagiri, Inagi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/849,067

(22) Filed: Sep. 9, 2015

(65) Prior Publication Data
US 2016/0099716 A1 Apr. 7, 2016

(30) Foreign Application Priority Data

Oct. 1, 2014 (JP) .................................. 2014-202881

(51) Int. Cl.
*H03L 1/02* (2006.01)
*H03L 7/099* (2006.01)
*H03L 7/18* (2006.01)

(52) U.S. Cl.
CPC ............ *H03L 1/026* (2013.01); *H03L 7/0994* (2013.01); *H03L 7/099* (2013.01); *H03L 7/18* (2013.01)

(58) Field of Classification Search
USPC ........ 327/291, 147, 150, 156, 159, 512–513; 331/17, 25
See application file for complete search history.

(56) References Cited

U.S. PATENT DOCUMENTS

| | | | | | |
|---|---|---|---|---|---|
| 5,477,194 | A | * | 12/1995 | Nagakura | ............... H03L 7/189 331/10 |
| 5,604,468 | A | * | 2/1997 | Gillig | ...................... H03L 1/026 327/105 |
| 7,791,416 | B2 | * | 9/2010 | Kimura | ................... H03L 7/093 331/17 |
| 8,115,527 | B2 | * | 2/2012 | Kimura | ..................... H03L 7/14 327/147 |
| 8,140,040 | B1 | * | 3/2012 | Leon | ........................ H03L 1/00 327/156 |

FOREIGN PATENT DOCUMENTS

| | | |
|---|---|---|
| JP | 2010-068065 A | 3/2010 |
| JP | 2010-263503 A | 11/2010 |

* cited by examiner

*Primary Examiner* — An Luu
(74) *Attorney, Agent, or Firm* — Arent Fox LLP

(57) ABSTRACT

A control device for a clock generation circuit that generates a clock signal based on a reference signal from an outside, the control device includes: a storage device that stores frequency correction information for the clock signal according to a temperature condition of the clock generation circuit; and a processor that controls a frequency of the clock signal generated by the clock generation circuit under a second temperature condition, based on first and second frequency correction information according to a first temperature condition at first and second time points in the storage device.

14 Claims, 21 Drawing Sheets

FIG. 6

| TEMPERATURE CHANGE RATE [°C/hour] \ TEMPERATURE [°C] | ... | -0.1 | 0 | 0.1 | 0.2 | 0.3 | 0.4 | ... |
|---|---|---|---|---|---|---|---|---|
| ... | | | | | | | | |
| 27.5 | | | 210,520<br>2014/8/7 17:30 | 210,520<br>2014/8/6 12:30 | 210,521<br>2014/8/8 12:30 | | | |
| 27.4 | | 210,510<br>2014/4/15 11:30 | 210,519<br>2014/8/8 10:30 | 210,519<br>2014/8/8 11:30 | | 210,520<br>2014/8/5 12:30 | 210,520<br>2014/8/14 12:30 | |
| 27.3 | | 210,515<br>2014/8/9 16:30 | 210,516<br>2014/8/8 15:30 | 210,516<br>2014/8/8 11:30 | | 210,517<br>2014/7/14 11:30 | 210,518<br>2014/8/13 13:30 | |
| 27.2 | | 210,513<br>2014/8/10 16:30 | 210,513<br>2014/8/9 15:30 | | 210,514<br>2014/8/14 11:30 | 210,514<br>2014/7/15 11:30 | 210,509<br>2014/5/15 11:30 | |
| 27.1 | | 210,511<br>2014/8/11 15:30 | 210,512<br>2014/8/11 14:30 | 210,506<br>2014/5/15 10:30 | 210,512<br>2014/8/12 12:30 | | | |
| 27.0 | | 210,510<br>2014/8/11 16:30 | | | 210,512<br>2014/8/10 14:30 | | | |
| ... | | | | | | | | |

FIG. 7

| TEMPERATURE CHANGE RATE [°C/hour] / TEMPERATURE [°C] | ... | -0.1 | 0 | 0.1 | 0.2 | 0.3 | 0.4 | ... |
|---|---|---|---|---|---|---|---|---|
| ... | | | | | | | | |
| 27.5 | | | 210,520 2014/8/7 17:30 | 210,520 2014/8/6 12:30 | 210,521 2014/8/8 12:30 | | | |
| 27.4 | | 210,518 2014/8/15 11:30 | 210,519 2014/8/8 10:30 | 210,519 2014/8/8 11:30 | | 210,520 2014/8/5 12:30 | 210,520 2014/8/14 12:30 | |
| 27.3 | | 210,515 2014/8/9 16:30 | 210,516 2014/8/9 15:30 | 210,516 2014/8/12 13:30 | | 210,517 2014/7/14 11:30 | 210,518 2014/8/13 13:30 | |
| 27.2 | | 210,513 2014/8/10 16:30 | 210,513 2014/8/10 15:30 | | 210,514 2014/8/14 11:30 | 210,514 2014/7/15 11:30 | 210,515 2014/8/15 11:30 | |
| 27.1 | | 210,511 2014/8/11 15:30 | 210,512 2014/8/11 14:30 | 210,512 2014/8/15 11:30 | 210,512 2014/8/12 12:30 | | | |
| 27.0 | | 210,510 2014/8/11 16:30 | | | 210,512 2014/8/10 14:30 | | | |
| ... | | | | | | | | |

CONTROL DEVICE FOR CLOCK GENERATION CIRCUIT, CONTROL METHOD FOR CLOCK GENERATION CIRCUIT, AND CLOCK GENERATION CIRCUIT

CROSS-REFERENCE TO RELATED APPLICATION

This application is based upon and claims the benefit of priority of the prior Japanese Patent Application No. 2014-202881, filed on Oct. 1, 2014, the entire contents of which are incorporated herein by reference.

FIELD

The embodiments discussed herein are related to a control device for a clock generation circuit, a control method for a clock generation circuit, and a clock generation circuit.

BACKGROUND

There are known clock signal generation devices that generate clock signals. For instance, a clock signal is used to synchronize processing to be executed by a communication device in order to perform communication, the communication device being provided in a clock signal generation device.

The clock signal generation device generates a clock signal based on a reference signal from the outside. For instance, the reference signal is a signal in accordance with Precision Time Protocol (PTP) or a Global Positioning System (GPS) signal. Thus, communication timing may be synchronized, for instance, between communication devices each provided with a clock signal generation device. Also, for instance, the frequency of a wireless signal may be matched between communication devices each provided with a clock signal generation device.

For instance, in the case where a clock signal is generated based on a reference signal from the outside as an example of a clock signal generation device, the temperature of the clock signal generation device and frequency correction information indicating a correction amount for the frequency of the clock signal are stored in association with each other. Furthermore, the clock signal generation device, when being unable to obtain a reference signal, controls the frequency of the clock signal based on a detected temperature, and stored temperatures and frequency correction information. Thus, the clock signal generation device, even when being unable to obtain a reference signal, may achieve a clock signal frequency which is close to the frequency of a clock signal that is generated based on a reference signal.

The relationship between the temperature of the clock signal generation device and the frequency of the clock signal changes with the passage of time. After the temperature of the clock signal generation device becomes a specific temperature, a state may continue in which the temperature is different from the specific temperature. In this case, the aforementioned relationship at the time of detection of stored temperatures and frequency correction information is likely to have a large difference with the aforementioned relationship at the current time point.

Therefore, when the frequency of the clock signal is controlled based on the stored temperatures and frequency correction information, the accuracy of the frequency of the clock signal is likely to decrease as the interval between two points in time increases where the temperature of the clock signal generation device becomes the specific temperature at both points.

The following are reference documents.
[Document 1] Japanese Laid-open Patent Publication No. 2010-068065 and
[Document 2] Japanese Laid-open Patent Publication No. 2010-263503.

SUMMARY

According to an aspect of the invention, a control device for a clock generation circuit that generates a clock signal based on a reference signal from an outside, the control device includes: a storage device that stores frequency correction information for the clock signal according to a temperature condition of the clock generation circuit; and a processor that controls a frequency of the clock signal generated by the clock generation circuit under a second temperature condition, based on first and second frequency correction information according to a first temperature condition at first and second time points in the storage device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a table illustrating example data in which temperature state, DDS parameter, and date/time are associated with one another and which is to be stored in the storage device illustrated in FIG. 3;

FIG. 7 is a table illustrating example data in which temperature state, DDS parameter, and date/time are associated with one another and which is to be stored in the storage device illustrated in FIG. 3;

DESCRIPTION OF EMBODIMENTS

Figure 1:
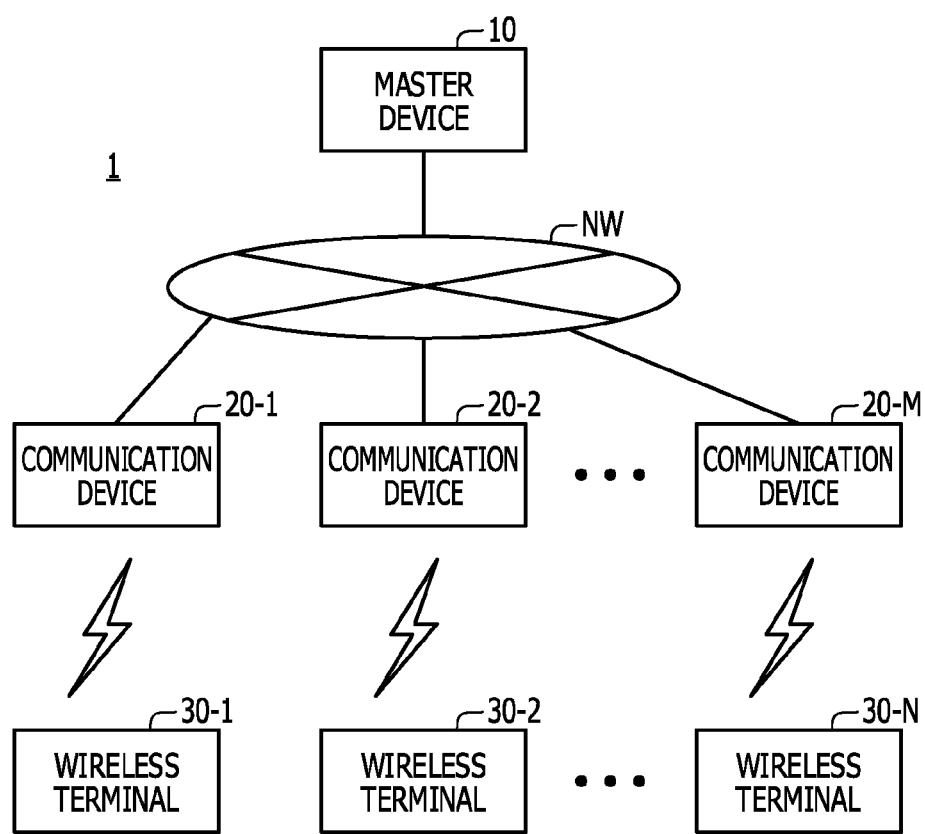
FIG. 1 is a block diagram illustrating an example configuration of a wireless communication system according to a first embodiment.

For instance, in TD-LTE system, hand-over may not be performed between base stations in the case where the timing of transmitting and receiving a wireless signal is not synchronized with high accuracy between the base stations. The TD-LTE system is a long term evolution (LTE) system in accordance with the time division duplex (TDD) system.

In the TD-LTE system, phase difference is specified to be within 1.5 μs, the phase difference indicating the difference in the timing of transmitting and receiving a wireless signal between base stations. For instance, when a base station is unable to obtain a reference signal from the outside, a mobile network operator may define the time during which the base station is operational, in accordance with the specification mentioned above. The time is called holdover time, for instance. The holdover time is 8 hours or 24 hours, for instance.

For instance, when the frequency accuracy of an oscillator is not within 0.052 part per billion (ppb), it is not possible to maintain a state in which the phase difference is within 1.5 μs for eight hours. For instance, when the frequency accuracy of an oscillator changes by 10 ppb according to a change in temperature, the phase difference may be greater than 1.5 μs after a lapse of 150 seconds.

On the other hand, the smaller the change in the frequency of a clock signal, according to a temperature and lapse of time, the larger the price of an oscillator. Therefore, when an inexpensive oscillator is used and a base station is unable to obtain a reference signal from the outside, the timing of transmitting and receiving a wireless signal may not be synchronized with high accuracy between the base station and another base station.

Hereinafter, embodiments of the present disclosure will be described with reference to the drawings. However, each of the embodiments described below is an exemplification. Consequently, application of various modifications and techniques, which are not explicitly stated below, to the embodiments is not excluded. It is to be noted that in the drawings referred to in the following embodiments, components labeled with the same symbol indicate the same or similar component unless an embodiment is explicitly specified as a modification or alteration.

<First Embodiment>
(Configuration)

As illustrated in FIG. 1, a wireless communication system 1 according to a first embodiment includes a master device 10, M pieces of communication devices 20-1, 20-2, . . . , 20-M, and N pieces of wireless terminals 30-1, 30-2, . . . , 30-N.

In this example, M indicates an integer greater than or equal to 2. Hereinafter, the communication device 20-m is also referred to as the communication device 20 when it is unnecessary to distinguish therebetween. Here, m indicates an integer between 1 to M inclusively. In this example, N indicates an integer greater than or equal to 1. Hereinafter, the wireless terminal 30-n is also referred to as the wireless terminal 30 when it is unnecessary to distinguish therebetween. Here, n indicates an integer between 1 to N inclusively.

The wireless communication system 1 performs wireless communication between the communication device 20 and the wireless terminal 30 in accordance with a predetermined wireless communication system. For instance, the predetermined wireless communication system is the TD-LTE system. It is to be noted that the wireless communication system may be a system (for instance, a system such as FDD-LTE, LTE-Advanced, or WiMAX) different from the TD-LTE system. FDD is an abbreviation of Frequency Division Duplex. WiMAX is an abbreviation of Worldwide Interoperability for Microwave Access.

The communication device 20-m forms a wireless area. The wireless area may be referred to as a coverage area or a communication area. For instance, the wireless area may be referred to as a cell such as a macrocell, a microcell, a nanocell, a picocell, a femtocell, a home cell, a small cell, or a sector cell. Each communication device 20 performs wireless communication with the wireless terminal 30 that is located in the wireless area formed by the communication device 20.

For instance, the communication device 20 is a base station, an access point, evolved Node B (eNB), or Node B (NB).

In this example, as illustrated in FIG. 1, each communication device 20 is communicably connected wiredly to a communication network (for instance, a core network) NW via a communication line. It is to be noted that each communication device 20 may be communicably connected wirelessly to the communication network NW.

The wireless terminal 30 performs communication with the communication device 20 that forms the wireless area, using wireless resources provided in the wireless area in which the terminal 30 is located. It is to be noted that the wireless terminal 30 may be referred to as a mobile station, a wireless equipment, a wireless device, a wireless terminal, a mobile terminal, a terminal device, or a user equipment (UE). For instance, the wireless terminal 30 is a mobile phone, a smartphone, a sensor, or a meter (measuring instrument). The wireless terminal 30 may be carried by a user or may be mounted on or fixed to a mobile object such as a vehicle.

The master device 10 is communicably connected wiredly to the communication network NW via a communication line. In this example, the master device 10 is communicably connected to each communication device 20 via the communication network NW. It is to be noted that the master device 10 may be communicably connected wirelessly to the communication network NW.

The master device 10 performs processing for synchronizing time with each communication device 20 in accordance with a predetermined time synchronous system. In this example, the time synchronous system is IEEE 1588. IEEE is an abbreviation of Institute of Electrical and Electronics Engineers. It is to be noted that the time synchronous system may be PTP or NTP. PTP is an abbreviation of Precision Time Protocol. NTP is an abbreviation of Network Time Protocol.

In this example, the master device 10 operates as a clock source. The clock source may be referred to as a master clock. It is to be noted that the master device 10 may be referred to as a control station, a control device, a control server, or a management server.

(Configuration of Communication Device 20)

Figure 2:
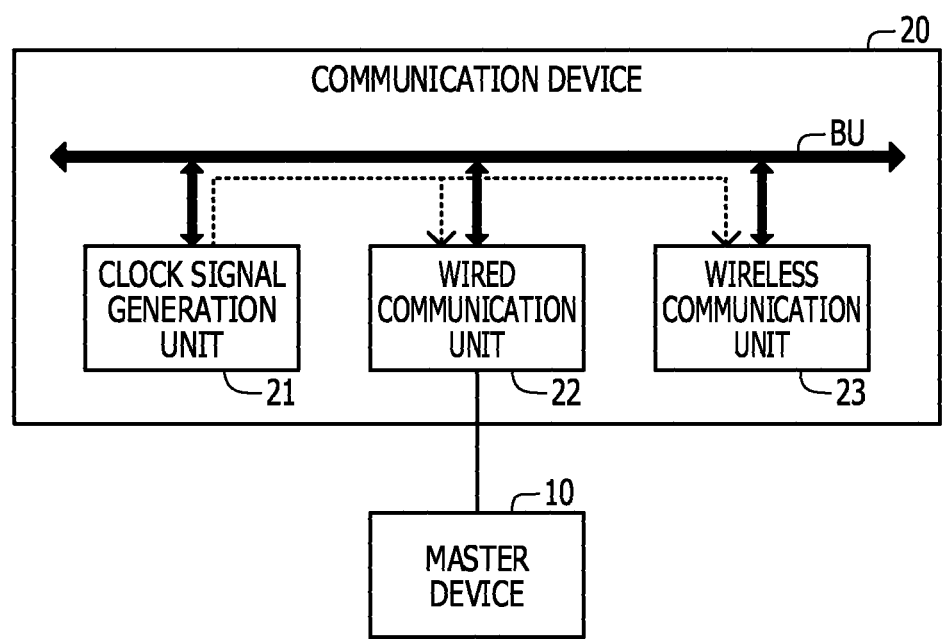
FIG. 2 is a block diagram illustrating an example configuration of the communication devices illustrated in FIG. 1.

Next, the configuration of the communication device 20 will be described. As illustrated in FIG. 2, the communication device 20 includes a clock signal generation unit 21, a wired communication unit 22, and a wireless communication unit 23 that are mutually connected via a bus BU. The clock signal generation unit 21 is an example clock signal generation device.

The clock signal generation unit 21 generates a clock signal and outputs the generated clock signal to each of the wired communication unit 22 and the wireless communication unit 23. The output of a clock signal may be referred to as supply of a clock signal.

For instance, the clock signal is used to synchronize the processing carried out by the communication device 20 for performing communication. For instance, the clock signal is used to synchronize the timing of transmitting and receiving a wireless signal between the communication devices 20. The timing of transmitting and receiving a wireless signal may be referred to as communication timing. The communication timing is, for instance, the timing of transmitting and receiving a wireless frame or a sub frame. For instance, the clock signal is used to match the frequency of wireless signals between the communication devices 20.

For instance, the clock signal generation unit 21 may generate a timing signal that indicates predetermined timing. For instance, a timing signal may be used to determine the timing of communicating a wireless frame or a sub frame. Also, the timing signal may be generated based on a clock signal.

Figure 3:
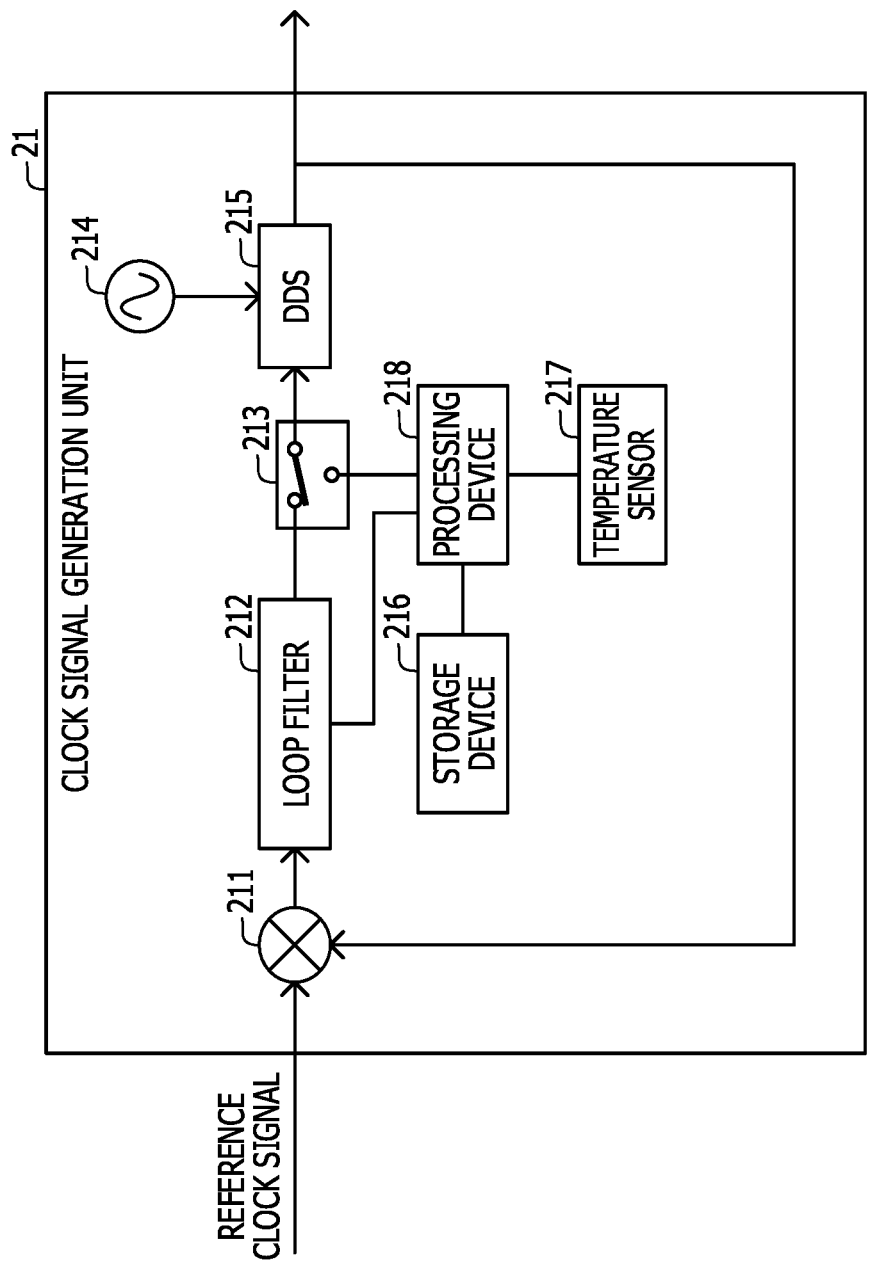
FIG. 3 is a block diagram illustrating an example configuration of the clock signal generation unit illustrated in FIG. 2.

As illustrated in FIG. 3, the clock signal generation unit 21 includes a phase comparator 211, a loop filter 212, a switch 213, an oscillating circuit 214, a DDS 215, a storage device 216, a temperature sensor 217, and a processing device 218. DDS is an abbreviation of Direct Digital Synthesizer.

In this example, the phase comparator 211, the loop filter 212, the oscillating circuit 214, and the DDS 215 achieve a phase locked loop (PLL). The phase comparator 211, the loop filter 212, the oscillating circuit 214, and the DDS 215 are an example generation unit that generates a clock signal based on a reference signal from the outside. The generation unit may be referred to as a clock generation circuit. In this example, the switch 213, the storage device 216, the temperature sensor 217, and the processing device 218 are an example control device for a clock signal generation device.

The oscillating circuit 214 generates a primary clock signal having a predetermined frequency. In this example, the oscillating circuit 214 includes a crystal oscillator. In this example, the crystal oscillator is an oven controlled crystal oscillator (OCXO). It is to be noted that instead of a crystal oscillator or in addition to a crystal oscillator, the oscillating circuit 214 may include a ceramic oscillator, a silicon oscillator, a rubidium atomic oscillator, or a cesium atomic oscillator.

The DDS 215 generates a secondary clock signal based on the primary clock signal generated by the oscillating circuit 214.

In this example, the DDS 215 pre-stores information in which a phase corresponding value that corresponds to a phase in a period of a clock signal is associated with a signal value that is the value of the clock signal in the phase. Furthermore, the DDS 215 stores a DDS parameter that is outputted by the loop filter 212 or the processing device 218 via the switch 213. In this example, the DDS parameter indicates an amount of change in the phase corresponding value. The DDS parameter may be referred to as a DDS control value, a control value, or a parameter.

In addition, the DDS 215 stores the current phase corresponding value. Furthermore, the DDS 215 obtains a signal value which is associated with stored phase corresponding value in synchronization with a primary clock signal, and updates the stored current phase corresponding value by adding the stored DDS parameter. For instance, the DDS 215 obtains a signal value and updates the phase corresponding value for each lapse of a period of the primary clock signal.

Furthermore, the DDS 215 converts a digital signal to an analog signal and outputs the converted signal as a secondary clock signal, the digital signal including obtained signal value. In this example, the secondary clock signal outputted by the DDS 215 is a clock signal that is outputted by the clock signal generation unit 21.

Therefore, in this example, the frequency of the clock signal outputted by the clock signal generation unit 21 is changed by changing the DDS parameter. The DDS parameter is example frequency correction information that indicates a correction amount for the frequency of a clock signal.

The phase comparator 211 outputs a phase difference signal that is a signal according to the phase difference between a reference clock signal inputted to the clock signal generation unit 21 and a secondary clock signal outputted by the DD S215. In this example, as described below, the reference clock signal is generated by the wired communication unit 22 based on a signal from the master device 10.

In this example, when the phase of a secondary clock signal outputted by the DDS 215 leads the phase of a reference clock signal, the phase difference signal has a value that decreases the frequency of the secondary clock signal generated by the DDS 215. Furthermore, in this example, when the phase of a secondary clock signal outputted by the DDS 215 lags behind the phase of a reference clock signal, the phase difference signal has a value that increases the frequency of the secondary clock signal generated by the DDS 215.

For instance, the phase comparator 211 may be achieved using exclusive OR and a charge pump.

The loop filter 212 smooths the phase difference signal. In this example, the loop filter 212 is a low pass filter.

The switch 213 switches the connection end of the DDS 215 between the loop filter 212 and the processing device 218 according to the control by the processing device 218.

The temperature sensor 217 detects the temperature of the oscillating circuit 214 and outputs information indicating the detected temperature to the processing device 218.

In this example, the storage device 216 is semiconductor memory. The storage device 216 may be a nonvolatile memory. For instance, the storage device 216 is a flash memory. In addition, the storage device 216 may be a RAM, a HDD, an SSD, or an organic memory. RAM is an abbreviation of Random Access Memory. HDD is an abbreviation of Hard Disk Drive. SSD is an abbreviation of Solid State Drive. It is to be noted that the storage device 216 may include a recording media and a reading device, the recording media such as a flexible disc, an optical disc, a magneto optical disc, and a semiconductor memory, the reading device capable of reading information from the recording media.

The processing device 218 controls the operation of the clock signal generation unit 21. In this example, the processing device 218 is a central processing unit (CPU). In this example, the processing device 218 achieves the function described below by executing a program stored in the storage device 216. In this example, execution of a program is achieved by temporarily storing information into the storage device 216 and processing the stored information by the processing device 218. It is to be noted that at least part of the storage device 216 may be built in the processing device 218.

It is to be noted that the function of the processing device 218 may be achieved by a large scale integration (LSI) or a programmable logic device (PLD).

Figure 4:
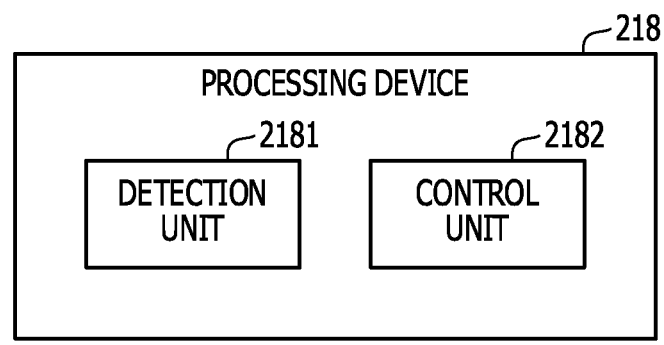
FIG. 4 is a block diagram illustrating an example function of the processing device illustrated in FIG. 3.

As illustrated in FIG. 4, the function of the processing device 218 includes a detection unit 2181 and a control unit 2182.

The control unit 2182 determines whether or not a reference clock signal is inputted to the clock signal generation unit 21.

When it is determined that a reference clock signal is inputted to the clock signal generation unit 21, the control unit 2182 controls the operational mode of the clock signal generation unit 21 at the input time mode. The input time mode may be referred to as an external signal synchronous mode.

In this example, in the external signal synchronous mode, the switch 213 breaks the connection between the DDS 215 and the processing device 218 and connects the DDS 215 and the loop filter 212. Therefore, in the external signal synchronous mode, the frequency of the clock signal outputted by the clock signal generation unit 21 is corrected based on a reference signal from the outside. In other words, in the external signal synchronous mode, the clock signal generation unit 21 generates a clock signal based on the reference signal from the outside.

Furthermore, in the external signal synchronous mode, the control unit 2182 stores data in the storage device 216, the data in which the temperature state of the oscillating circuit 214, date/time, and the DDS parameter are associated with one another. In this example, the temperature state includes a temperature and a temperature change rate that indicates an amount of change in the temperature per unit time.

Storing a DDS parameter in association with the temperature state of the oscillating circuit 214 is example of storing a DDS parameter according to the temperature condition of the oscillating circuit 214. In this example, the temperature condition of the oscillating circuit 214 is that the temperature state of the oscillating circuit 214 is in a certain temperature state. Thus, that the temperature state of the oscillating circuit 214 is in a certain temperature state is an example of an event that the temperature condition corresponding to the temperature state is satisfied. For instance, that the temperature state of the oscillating circuit 214 is in ith temperature state is an example of an event that ith temperature condition is satisfied. Here, i indicates a natural number.

In this example, the temperature condition includes a condition for each of a temperature and a temperature change rate that indicates an amount of change in the temperature per unit time. It is to be noted that the temperature condition may be a condition for only one of the temperature and the temperature change rate.

Hereinafter, storage of data in the external signal synchronous mode will be described.

The detection unit 2181 detects a temperature by the temperature sensor 217 for each lapse of a predetermined detection period (for instance, for one second), and detects a DDS parameter outputted by the loop filter 212. The detection of a temperature and a DDS parameter may be referred to as acquisition of a temperature and a DDS parameter. Furthermore, the detection unit 2181 holds the detected temperature, DDS parameter and the date/time of the detection in association with one another until a predetermined calculation time (for instance, one hour) elapses since the detection of the temperature and DDS parameter.

For each lapse of the calculation time, the detection unit 2181 calculates a statistical value of detected temperatures in the time interval from the calculation time before the current date/time to the current date/time. Furthermore, for each lapse of the calculation time, the detection unit 2181 calculates a statistical value of detected DDS parameters in the time interval from the calculation time before the current date/time to the current date/time. In this example, the statistical value is an average value. It is to be noted that the statistical value may be a maximum, a minimum or the middle value between the maximum and the minimum.

For each lapse of the calculation time, the detection unit 2181 applies the least square method to detected temperatures and the date/time of detection using a linear function, thereby obtaining the slope of an approximate straight line, that indicates the temperature change rate, the temperatures being detected in the time interval from the calculation time before the current date/time to the current date/time. In this example, the e change rate indicates an amount of change per unit time in the temperature detected by the temperature sensor 217.

In this example, for each lapse of the calculation time, the control unit 2182 stores data in the storage device 216, the data in which the statistical value of temperatures, the statistical value of DDS parameters, the temperature change rate, and date/time representing the time interval from the calculation time before the current date/time to the current date/time are associated with one another. In this example, the date/time representing the above-mentioned time interval is the middle value between the calculation time before the current date/time and the current date/time. It is to be noted that the date/time representing the above-mentioned time interval may be the date/time when the above-mentioned time interval starts or the date/time when the above-mentioned time interval ends.

The date/time representing the above-mentioned time interval may be referred to as a time point. The calculated statistical value of temperatures and the obtained temperature change rate are an example temperature state detected at the date/time representing the above-mentioned time interval. The calculated statistical value of DDS parameters is an example DDS parameter detected at the date/time representing the above-mentioned time interval. Thus, in other words, for each lapse of the calculation time, the control unit 2182 stores data in the storage device 216, the data in which the temperature state detected at the current time point the DDS parameter detected at the current time point, and the current time point are associated with one another.

Figure 5:
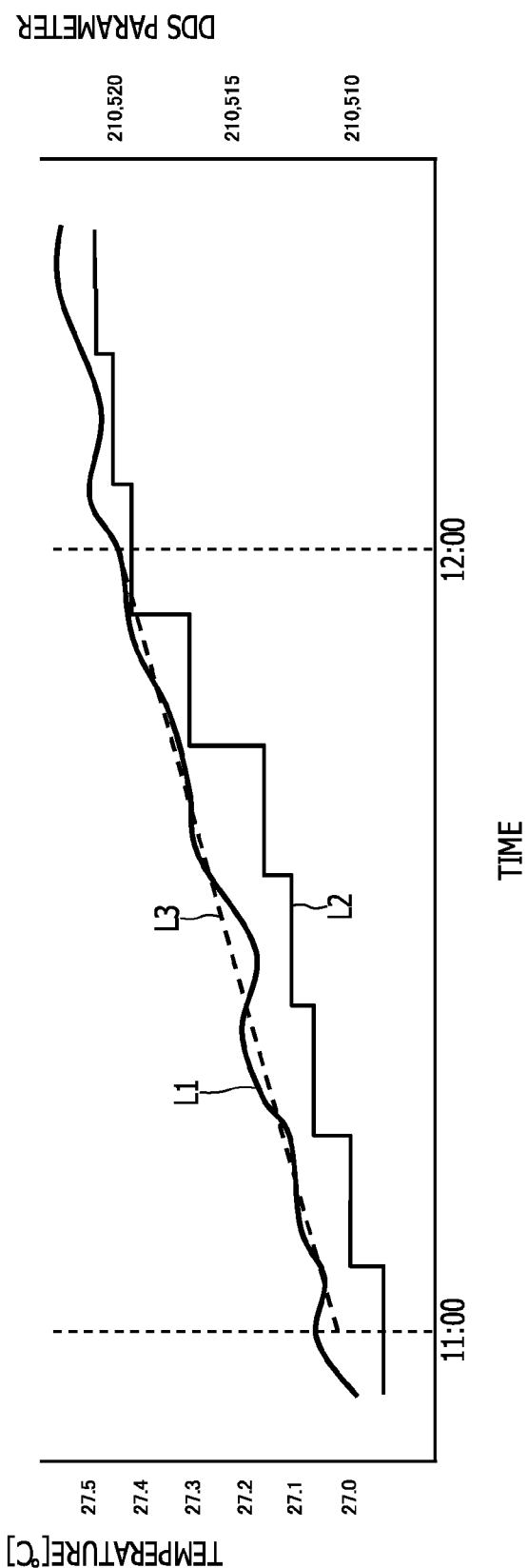
FIG. 5 is a graph illustrating an example change of temperature and DDS parameter with respect to time.

For instance, as illustrated in FIG. 5, it is assumed that the temperature detected by the temperature sensor 217 changes as indicated by a solid line L1, and the DDS parameter outputted by the loop filter 212 changes as indicated by a solid line L2 during the period from 11:00 to 12:00 on Aug. 1, 2014. In this case, for instance, at 12:00 on Aug. 1, 2014, the detection unit 2181 calculates an average value of temperature of 27.2° C., obtains the slope of an approximate straight line L3 of 0.4° C./hour, and calculates an average value of DDS parameter of 210,513.

The control unit 2182 then stores data in the storage device 216, the data in which 27.2° C. as the temperature, 210,513 as the DDS parameter, 0.4° C./hour as the temperature change rate, and 11:30 on Aug. 1, 2014 as the date/time are associated with one another.

In this manner, the processing device 218 stores data in the storage device 216 in the external signal synchronous mode, the data in which the temperature state, the date/time and the DDS parameter are associated with one another.

In this example, as illustrated in FIG. 6, the data stored by the storage device 216 is table format data. Set of data stored by the storage device 216 may be referred to as a DDS control database.

In this example, when data, which is detected at the current time point and includes the temperature state, is not stored yet, data storage is performed by storing the new data including the temperature state in the storage device 216.

On the other hand, when pre-stored data includes the temperature state detected at the current time point, data storage is performed by updating the DDS parameter and date/time in the stored date to the DDS parameter detected at the current time point and the current time point.

In this case, when the time difference between the date/time in the data including the temperature state detected at the current time point before the update and the current time point is greater than or equal to a first threshold value (for instance, three months), the control unit 2182 also updates the data including a different temperature state from the temperature state detected at the current time point. When the above-mentioned time difference is smaller than the first threshold value, the control unit 2182 does not update the data including a different temperature state from the temperature state detected at the current time point.

It is to be noted that instead of based on the above-mentioned time difference, the control unit 2182 may determine whether or not data is updated based on the absolute value of the difference between the DDS parameter in the data including a temperature state detected at the current time point and the DDS parameter detected at the current time point. For instance, the control unit 2182 does not update data when the absolute value of the difference between the DDS parameters is smaller than a parameter threshold value, but may update the data when the absolute value of the difference between the DDS parameters is greater than or equal to the parameter threshold value.

Alternatively, the control unit 2182 may not update the data when the above-mentioned time difference is smaller than the first threshold value and the absolute value of the difference between the DDS parameters is smaller than the parameter threshold value, but may be the data otherwise.

Hereinafter, update of data including a different temperature state from the temperature state detected at the current time point will be described.

The control unit 2182 calculates a parameter change rate based on the DDS parameter and date/time in pre-stored data including the temperature state detected at the current time point, and the DDS parameter detected at the current time point and the current time point. In this example, the DDS parameter detected at the current time point and the current time point are held temporarily in the storage device 216. The parameter change rate indicates an amount of change per unit time in the DDS parameter. The pre-stored data including the temperature state detected at the current time point may be referred to as stored data.

In this example, the control unit 2182 calculates parameter change rate R based on Numerical Expression 1. $V_1$ and $t_1$ indicate the DDS parameter and date/time in the stored data, respectively. $V_2$ and $t_2$ indicate the DDS parameter detected at the current time point and the current time point, respectively.

$$R=(V_2-V_1)/(t_2-t_1) \quad \text{(Numerical Expression 1)}$$

In this example, the parameter change rate R increases as the value obtained by subtracting DDS parameter $V_1$ from DDS parameter $V_2$ increases. The value obtained by subtracting DDS parameter $V_1$ from DDS parameter $V_2$ is an example difference between the DDS parameter $V_2$ and the DDS parameter $V_1$.

In this example, the parameter change rate R decreases as the value obtained by subtracting date/time $t_1$ from date/time $t_2$ increases. The value obtained by subtracting date/time $t_1$ from date/time $t_2$ is an example difference between the date/time $t_2$ and the date/time $t_1$.

The control unit 2182 extracts target data to be updated from the pre-stored data that includes a different temperature state from the temperature state detected at the current time point. The target data to be updated may be referred to as update target data. In this example, the control unit 2182 extracts data as update target data, the data including date/time with a time difference greater than or equal to a second threshold value (for instance, three months) with respect to the current time point. It is to be noted that the second threshold value may be different from the first threshold value.

The control unit 2182 updates each of the extracted pieces of update target data based on the DDS parameter and date/time in the update target data, the current time point, and the calculated parameter change rate. In this example, the control unit 2182 updates the DDS parameter in the update target data based on Numerical Expression 2 and updates the date/time in the update target data to the current time point.

$$V_3'=V_3+R\cdot(t_c-t_3) \quad \text{(Numerical Expression 2)}$$

$V_3$ and $t_3$ indicate the DDS parameter in the update target data and the date/time, respectively. $V_3'$ indicates the value of updated DDS parameter in the update target data, and tc indicates the current time point. The second term $R\cdot(t_c-t_3)$ on the right-hand side in Numerical Expression 2 above may be referred to as an adjustment amount. The adjustment amount may be understood as a correction amount for a change in the DDS parameter with the passage of time.

In this example, the value $V_3'$ of updated DDS parameter increases as the parameter change rate R increases. In this example, the value $V_3'$ of updated DDS parameter decreases as the value obtained by subtracting the date/time $t_3$ from the current time point $t_c$ increases. The value obtained by subtracting the date/time $t_3$ from the current time point $t_c$ is an example difference between the current time point $t_c$ and the date/time $t_3$.

In this example, out of pre-stored data including a different temperature state from the temperature state detected at the current time point, the control unit 2182 does not update the data including date/time with a time difference smaller than the second threshold value.

For instance, as illustrated in FIG. 6, it is assumed that data is already stored in which 27.2° C. and 0.4° C./hour as the temperature state, 210,509 as the DDS parameter, and 11:30 on May 15, 2014 as the date/time are associated with one another. In this case, it is assumed that 27.2° C. and 0.4° C./hour as the temperature state were detected and 210,515 as the DDS parameter was detected at 12:00 on Aug. 15, 2014.

In this case, the control unit 2182 determines that the time difference between the date/time in the pre-stored data including the temperature state detected at the current time point and the current time point is greater than or equal to the first threshold value (three months in this example). The control unit 2182 then calculates the parameter change rate R based on Numerical Expression 1 above. In this example, the control unit 2182 calculates (210,515−210,509)/3 [month]=2 [1/month] that indicates the parameter change rate R.

Furthermore, in this example, the control unit 2182 extracts data as update target data, the data including date/time with a time difference greater than or equal to the second threshold value (three months in this example) with respect to the current time point, that is, the data including 27.4° C. and −0.1° C./hour and the data including 27.1° C. and 0.1° C./hour.

Based on Numerical Expression 2 above, the control unit 2182 then calculates 210,510+2·4=210,518 as the post-update value of DDS parameter in the update target data including 27.4° C. and −0.1° C./hour. As illustrated in FIG. 7, the control unit 2182 updates DDS parameter to the calculated value of 210,518, the DDS parameter being in the update target data including 27.4° C. and −0.1° C./hour. Furthermore, the control unit 2182 updates the date/time in the update target data to 11:30 on Aug. 15, 2014 that is the current time point.

Similarly, based on Numerical Expression 2 above, the control unit 2182 calculates 210,506+2·3=210,512 as the post-update value of DDS parameter in the update target data including 27.1° C. and 0.1° C./hour. As illustrated in FIG. 7, the control unit 2182 updates DDS parameter to the calculated value of 210,512, the DDS parameter being in the update target data including 27.1° C. and 0.1° C./hour. Furthermore, the control unit 2182 updates the date/time in the update target data to 11:30 on Aug. 15, 2014 that is the current time point.

In addition, the control unit 2182 updates a certain DDS parameter to 210,515 that is the DDS parameter detected at the current time point, the certain DDS parameter being in the pre-stored data including 27.2° C. and 0.4° C./hour as the temperature state detected at the current time point. Furthermore, the control unit 2182 updates the date/time in the data to 11:30 on Aug. 15, 2014 that indicates the current time point.

In this manner, in addition to the data including the temperature state detected at the current time point, the control unit 2182 also updates the data including a different temperature state from the temperature state detected at the current time point.

Therefore, change in the DDS parameter with the passage of time in the first temperature condition may be reflected to data corresponding to the second temperature condition. Even when the second temperature condition is not likely to be satisfied, the DDS parameter for the second temperature condition may be corrected to an appropriate value.

As described above, out of pre-stored data including a different temperature state from the temperature state detected at the current time point, the control unit 2182 does not update the data including date/time with a time difference smaller than the second threshold value. The date/time in the pre-stored data including a different temperature state from the temperature state detected at the current time point may be referred to as a third time point. In other words, when the difference between the third time point and the current time point is smaller than the aforementioned second threshold value, the control unit 2182 controls the frequency of the clock signal generated under the second temperature condition as described later based on the DDS parameter detected under the second temperature condition.

As the difference between the third time point and the current time point decreases, the relationship between the frequency of a generated clock signal and the temperature condition of the oscillating circuit 214 at the third time point becomes closer to the relationship at the current time point. Therefore, with the control unit 2182, it is possible to maintain sufficiently high accuracy of the frequency of a clock signal. In addition, processing load of the processing device 218 may be reduced compared with case where the frequency of a clock signal is corrected based on a corrected value of the DDS parameter detected under the second temperature condition, for instance.

As described above, when the time difference between the date/time in the data including the temperature state detected at the current time point and the current time point is smaller than the first threshold value, the control unit 2182 does not update the pre-stored data that includes a different temperature state from the temperature state detected at the current time point. The date/time in the data including the temperature state detected at the current time point may be referred to as a first time point. In other words, when the difference between the first time point and a second time point is smaller than the aforementioned first threshold value, the control unit 2182 controls the frequency of the clock signal generated under the second temperature condition as described later based on the DDS parameter detected under the second temperature condition. In this example, the second time point is the current time point.

As the difference between the first time point and the second time point decreases, the difference between the DDS parameter detected at the first time point and the DDS parameter detected at the second time point decreases. Therefore, the correction amount of the frequency of a clock signal based on the DDS parameters detected at the first and second points of time also decreases. Thus, with the control unit 2182, it is possible to maintain sufficiently high accuracy of the frequency of a clock signal. In addition, processing load of the processing device 218 may be reduced compared with case where the frequency of a clock signal is corrected based on a corrected value of the DDS parameter detected under the second temperature condition, for instance.

On the other hand, the change in the DDS parameter with the passage of time may vary with the temperature state of the oscillating circuit 214. In this case, the data extracted as update target data may be limited to the data which includes a temperature state close to the temperature state detected at the current time point. For instance, the data extracted as update target data may be limited to the data which includes a temperature with a difference in absolute value smaller than a predetermined threshold value with respect to the temperature detected at the current time point and which includes a temperature change rate with a difference in absolute value smaller than a predetermined threshold value with respect to the temperature change rate detected at the current time point.

The control unit 2182, when determining that a reference clock signal is not inputted to the clock signal generation unit 21, controls the operational mode of the clock signal generation unit 21 at non-input time mode. The non-input time mode may be referred to as a holdover mode. For instance, in the case where a fault occurs in the master device 10 or in a communication path between the master device 10 and the communication device 20, a situation may occur in which a reference clock signal is not inputted to the clock signal generation unit 21.

In this example, in the holdover mode, the switch 213 breaks the connection between the DDS 215 and the loop filter 212 and connects the DDS 215 and the processing device 218. In the holdover mode, the processing device 218 outputs a DDS parameter to the DDS 215 via the switch 213.

Therefore, in the holdover mode, instead of based on the reference signal from the outside, the frequency of a clock signal outputted by the clock signal generation unit 21 is corrected based on the DDS parameter stored in the storage device 216. In other words, in the holdover mode, instead of based on the reference signal from the outside, the clock signal generation unit 21 generates a clock signal based on the DDS parameter stored in the storage device 216.

The frequency of a clock signal generated by the oscillating circuit 214 is likely to change according to the temperature state of the oscillating circuit 214. Thus, under a certain temperature condition, the DDS parameter used in the external signal synchronous mode is also outputted in the holdover mode by the processing device 218.

In this manner, similarly to the external signal synchronous mode, the accuracy of the frequency of the clock signal may be increased in the holdover mode too.

Hereinafter, the output of a DDS parameter in the holdover mode will be described.

The detection unit 2181 detects a temperature by the temperature sensor 217 for each lapse of a predetermined detection period (for instance, for one second), and holds the detected temperature and the date/time of the detection in association with each other until a predetermined calculation time (for instance, one hour) elapses since the detection of the temperature.

For each lapse of the detection period, the detection unit 2181 applies the least square method to detected temperatures and the date/time of detection using a linear function, thereby obtaining the slope and intercept of an approximate straight line, the temperatures being detected in the time interval from the calculation time before the current date/time to the current date/time.

The detection unit 2181 detects the temperature change rate at the current date/time, that is, the obtained slope of the approximate straight line. Furthermore, based on the obtained slope and intercept of the approximate straight line, the detection unit 2181 detects the temperature at the current date/time, the temperature corresponding to the current date/time in the approximate straight line.

The control unit 2182 determines whether or not data including the temperature and the temperature change rate of the current date/time is stored as the temperature state in the storage device 216, the temperature and the temperature change rate being detected by the detection unit 2181. When the data is stored, the control unit 2182 outputs the DDS parameter included in the data to the DDS 215.

Figure 8:
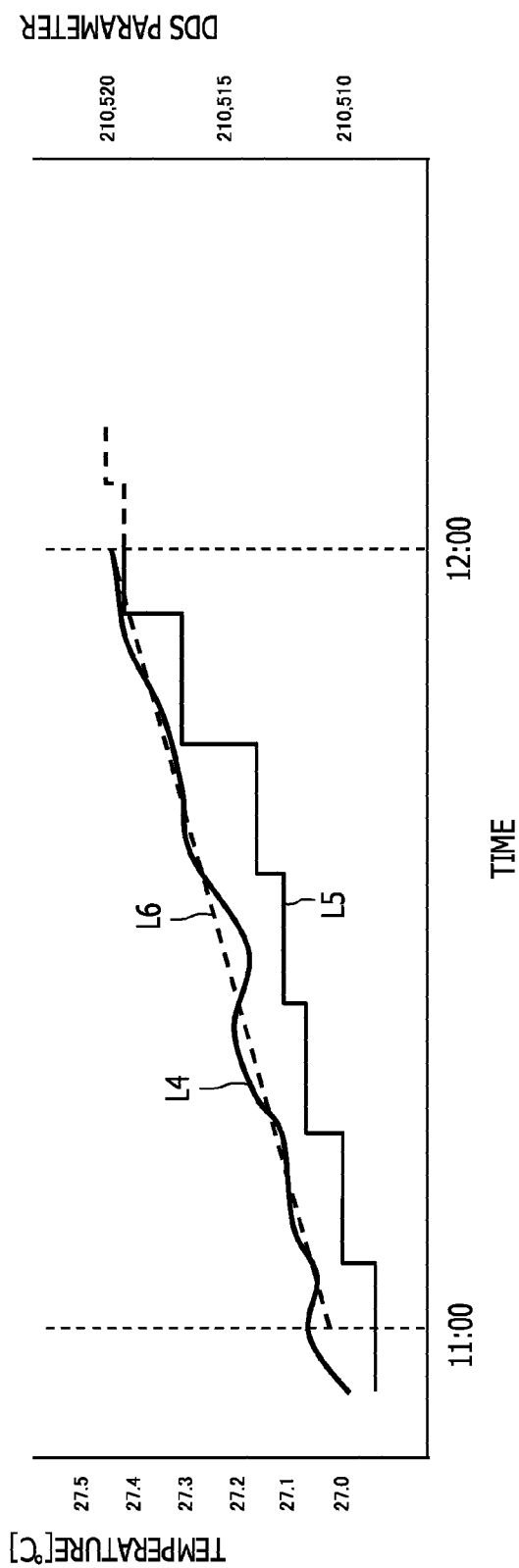
FIG. 8 is a graph illustrating an example change of temperature and DDS parameter with respect to time.

For instance, as illustrated in FIG. 8, it is assumed that the temperature detected by the temperature sensor 217 changes as indicated by a solid line L4, and the DDS parameter outputted by the processing device 218 changes as indicated by a solid line L5 during the period from 11:00 to 12:00 on Aug. 15, 2014. In this case, for instance, at 12:00 on Aug. 15, 2014, in an approximate straight line L6, the detection unit 2181 obtains 27.4° C. as the temperature corresponding to 12:00 on Aug. 15, 2014 and obtains 0.4° C./hour as the slope of the approximate straight line L6.

Furthermore, it is assumed that the storage device 216 stores data as illustrated in FIG. 7. In this case, the control unit 2182 outputs a DDS parameter of 210,520 to the DDS 215, the DDS parameter being in the pre-stored data including 27.4° C. and 0.4° C./hour.

When data including the detected temperature and temperature change rate at the current date/time is not stored as the temperature state, the control unit 2182 determines a DDS parameter by weighted average of other data. The control unit 2182 then outputs the determined DDS parameter to the DDS 215.

In this example, the weighted average data includes the detected temperature at the current date/time and the detected temperature change rate different from the temperature change rate at the current date/time. For instance, the weight of a weighted average decreases as the absolute value of the difference increases between the detected temperature change rate at the current date/time and the temperature change rate included in the weighted average data. For instance, the weighted average may be an interpolation, an extrapolation, or a linear interpolation.

The number of pieces of data for weighted average may be a predetermined number (for instance, two or three). In this case, data having a smaller difference in absolute value between the detected temperature change rate at the current date/time and the temperature change rate included in the weighted average data may be selected as the data for weighted average with a higher priority.

Figure 9:
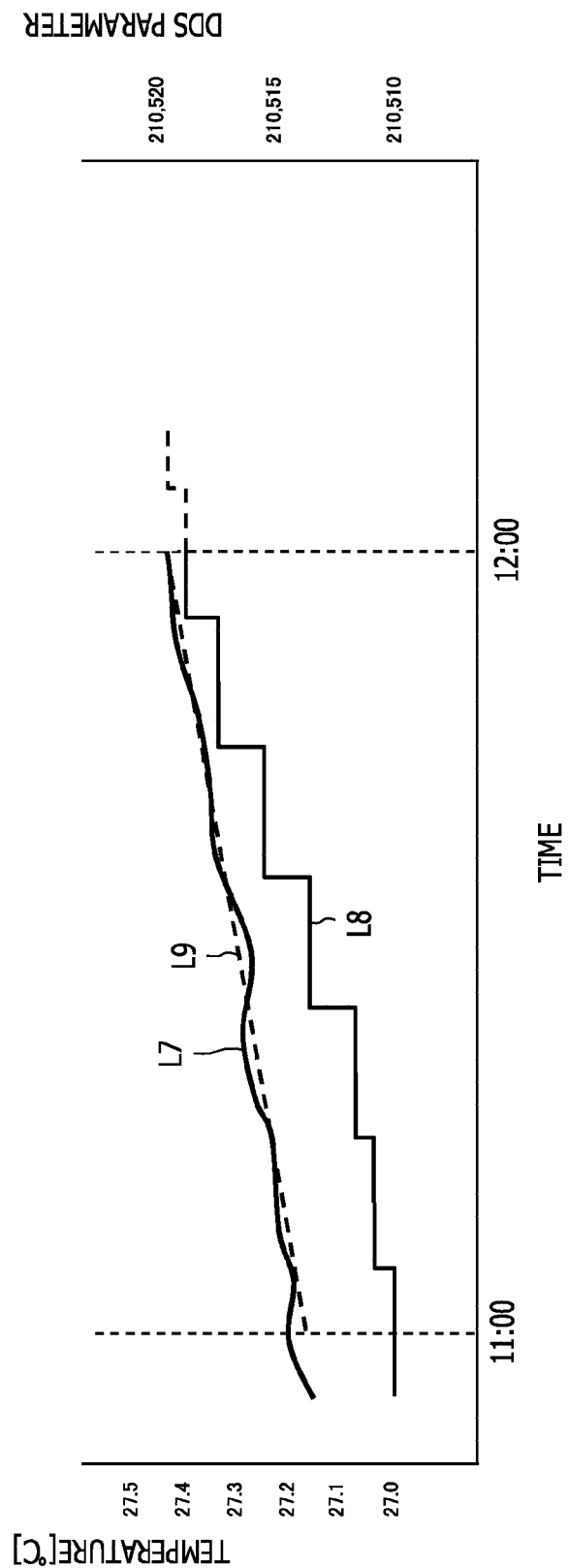
FIG. 9 is a graph illustrating an example change of temperature and DDS parameter with respect to time.

For instance, as illustrated in FIG. 9, it is assumed that the temperature detected by the temperature sensor 217 changes as indicated by a solid line L7, and the DDS parameter outputted by the processing device 218 changes as indicated by a solid line L8 during the period from 11:00 to 12:00 on Aug. 15, 2014. In this case, for instance, at 12:00 on Aug. 15, 2014, in an approximate straight line L9, the detection unit 2181 obtains 27.4° C. as the temperature corresponding to 12:00 on Aug. 15, 2014 and obtains 0.2° C./hour as the slope of the approximate straight line L9.

Furthermore, it is assumed that the storage device 216 stores data as illustrated in FIG. 7. In this case, the control unit 2182 outputs a value to the DDS 215, the value being obtained by weighted average of the DDS parameters in the pre-stored data including 27.4° C.

In this manner, in the holdover mode, the processing device 218 outputs a DDS parameter to the DDS 215 under the same temperature condition, the DDS parameter being used in the external signal synchronous mode.

The wired communication unit 22 of FIG. 2 operates according to the clock signal supplied from the clock signal generation unit 21. The wired communication unit 22 includes a communication port (not illustrated) to which a communication cable is connectable, and performs communication with other devices (for instance, the master device 10) connected to communication network NW by connecting to the communication network NW via the communication cable.

The wired communication unit 22 performs processing for synchronizing time with the master device 10 in accordance with the aforementioned time synchronous system. The wired communication unit 22 may perform processing for synchronizing time for each lapse of a predetermined period. In this example, the processing for synchronizing time is performed by transmitting a predetermined signal between the communication device 20 and the master device 10. The signal transmitted from the master device 10 to the communication device 20 in the processing for synchronizing time is an example reference signal.

For instance, the wired communication unit 22 may generate a synchronous clock signal, a 1PPS signal, or a time signal. A synchronous clock signal is used to synchronize with the processing for synchronizing time with other devices and time. The 1PPS signal is a signal that has a pulse per second. For instance, the 1PPS signal is a clock signal having a frequency of 1 Hz. The time signal is a signal that indicates the current date/time.

In this example, the wired communication unit 22 generates a 1PPS signal, and generates a reference clock signal based on the generated 1PPS signal. For instance, the wired communication unit 22 may generate a reference clock signal using a phase locked loop including a frequency divider. The wired communication unit 22 outputs the generated reference clock signal to the clock signal generation unit 21. The function of the wired communication unit 22 may be achieved by an LSI.

The wireless communication unit 23 of FIG. 2 operates according to a clock signal supplied from the clock signal generation unit 21. For instance, the wireless communication unit 23 may determine the timing of communication with the wireless terminal 30 according to the clock signal. For instance, the wireless communication unit 23 may determine the frequency of a wireless signal according to the clock signal.

The wireless communication unit 23 includes an antenna (not illustrated), and performs communication with the wireless terminal 30 in accordance with the aforementioned wireless communication system, the wireless terminal 30 being located in the wireless area formed via the antenna. The function of the wireless communication unit 23 may be achieved by an LSI.

(Operation)

The processing performed by the communication device 20 will be described with reference to FIGS. 10 to 12.

Figure 10:
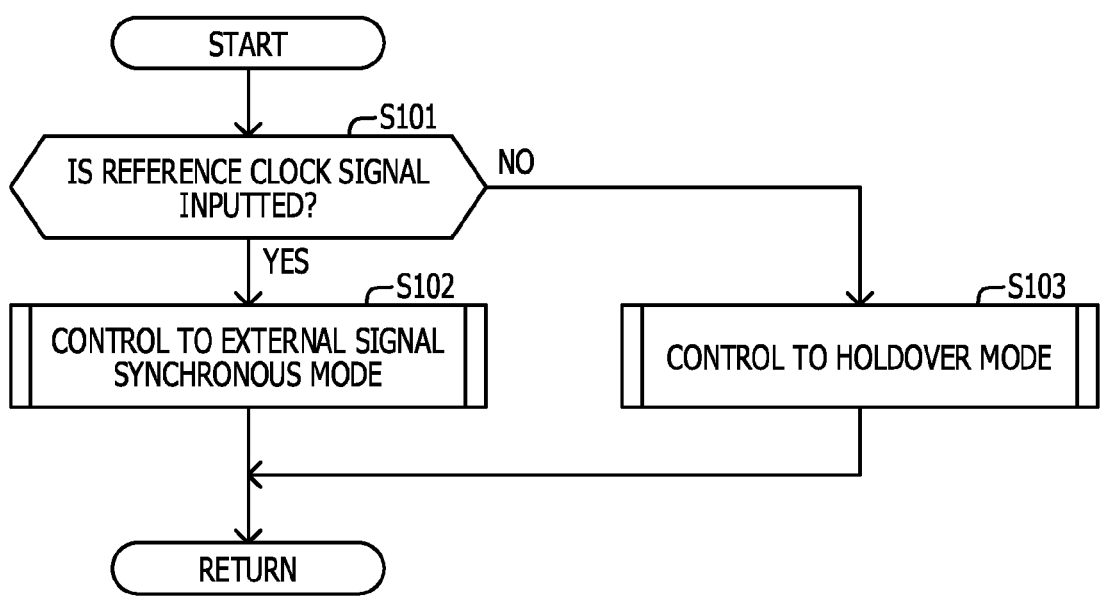
FIG. 10 is a flow chart illustrating example processing performed by the processing device illustrated in FIG. 3.

In this example, the processing device 218 of the communication device 20 performs the processing illustrated in FIG. 10 for each lapse of the aforementioned detection period (one second in this example).

In the processing illustrated in FIG. 10, the processing device 218 first determines whether or not the reference clock signal is inputted to the clock signal generation unit 21 (step S101 of FIG. 10).

When the reference clock signal is inputted to the clock signal generation unit 21, the processing device 218 makes determination of "Yes", and controls the clock signal generation unit 21 so that the clock signal generation unit 21 operates in the external signal synchronous mode (step S102 of FIG. 10).

On the other hand, when the reference clock signal is not inputted to the clock signal generation unit 21, the processing device 218 makes determination of "No", and controls the clock signal generation unit 21 so that the clock signal generation unit 21 operates in the holdover mode (step S103 of FIG. 10).

The processing device 218 then completes the processing illustrated in FIG. 10.

Figure 11:
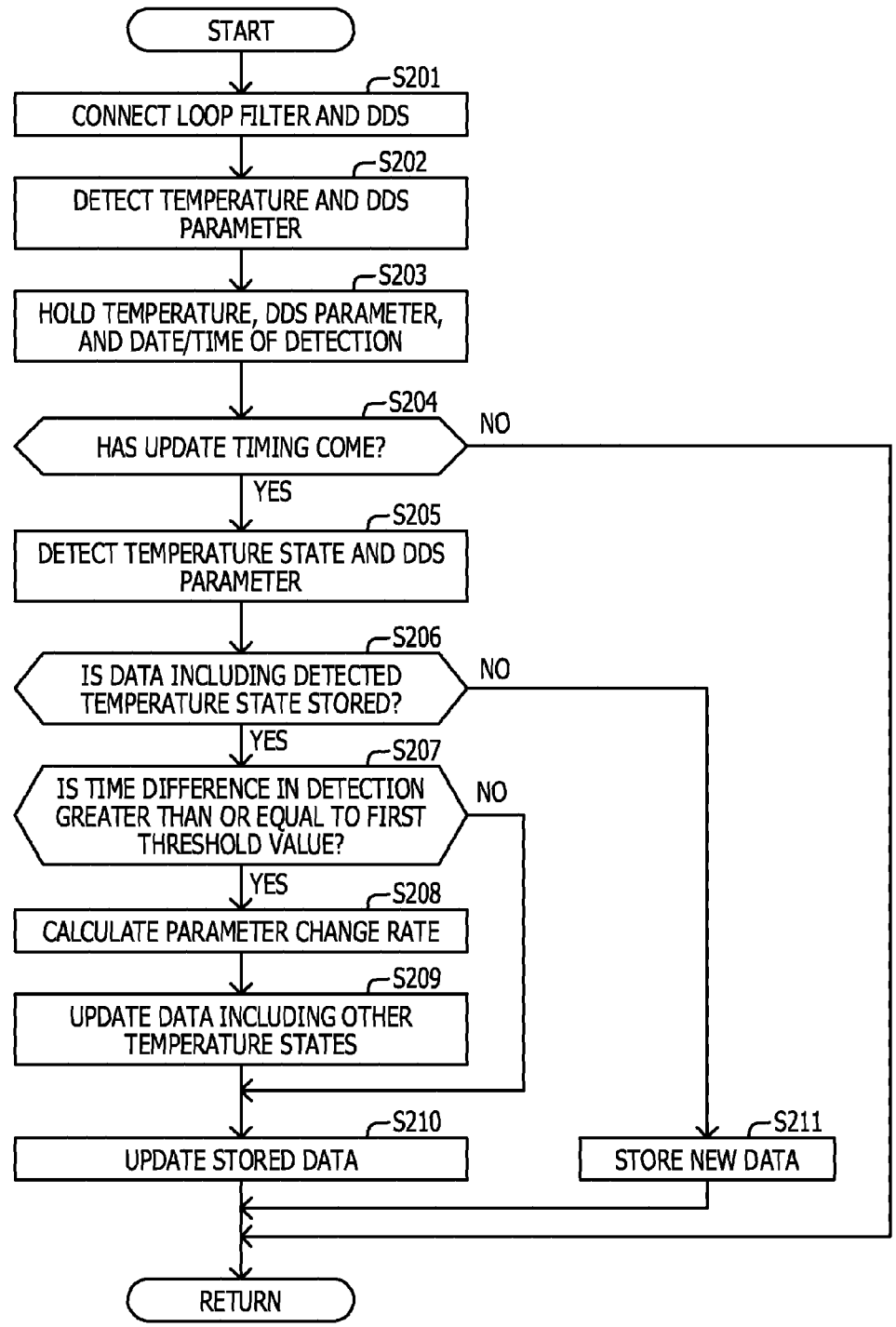
FIG. 11 is a flow chart illustrating example processing performed in external signal synchronous mode by the processing device illustrated in FIG. 3.

In this example, the processing of step S102 of FIG. 10 is the processing illustrated in FIG. 11.

In the processing illustrated in FIG. 11, the processing device 218 first controls the switch 213 to connect the loop filter 212 and the DDS 215 (step S201 of FIG. 11).

Subsequently, the processing device 218 detects a temperature by the temperature sensor 217 and detects the DDS parameter outputted by the loop filter 212 (step S202 of FIG. 11). The processing device 218 then holds the detected temperature, DDS parameter, and the date/time of the detection in association with one another until a predetermined calculation time (one hour in this example) elapses since the detection of the temperature and DDS parameter (step S203 of FIG. 11).

Next, the processing device 218 determines whether or not a predetermined update timing has come (step S204 of FIG. 11). In this example, the update timing is provided for each lapse of the aforementioned calculation time.

When the update timing has not come, the processing device 218 makes determination of "No" and completes the processing illustrated in FIG. 11.

On the other hand, when the update timing has come, the processing device 218 makes determination of "Yes" and the flow proceeds to step S205 of FIG. 11.

In step S205, the processing device 218 calculates the average value of the temperatures detected in the time interval from the calculation time before the current date/time to the current date/time. In this manner, the processing device 218 detects the temperature at the current time point (the date/time in the middle of the time interval from the calculation time before the current date/time to the current date/time in this example), that is, the calculated average value of the temperatures.

In addition, the processing device 218 calculates the average value of the DDS parameters detected in the time interval from the calculation time before the current date/time to the current date/time. In this manner, the processing device 218 detects the DDS parameter at the current time point, that is, the calculated average value of the DDS parameters.

In addition, the processing device 218 applies the least square method to detected temperatures and the date/time of detection using a linear function, thereby obtaining the slope of an approximate straight line, that is, the temperature change rate, the temperatures being detected in the time interval from the calculation time before the current date/time to the current date/time. In this manner, the processing device 218 detects the temperature change rate at the current time point, that is, the obtained temperature change rate.

Subsequently, the processing device 218 determines whether or not data including the detected temperature state is pre-stored in the storage device 216 (step S206 of FIG. 11).

When the data including the detected temperature state is not pre-stored in the storage device 216, the processing device 218 makes determination of "No" and the flow proceeds to step S211 of FIG. 11. The processing device 218 then stores new data in the storage device 216, the data in which the detected temperature at the current time point, DDS parameter at the current time point, and temperature change rate at the current time point, and the current time point are associated with one another (step S211 of FIG. 11). Subsequently, the processing device 218 completes the processing illustrated in FIG. 11.

On the other hand, when the data including the detected temperature state at the current time point is pre-stored in the storage device 216, the processing device 218 makes determination of "Yes" and the flow proceeds to step S207 of FIG. 11. The processing device 218 then determines whether or not the time difference between the date/time in the pre-stored data including the temperature state detected at the current time point and the current time point is greater than or equal to the first threshold value (three months in this example) (step S207 of FIG. 11). The time difference between the date/time in the pre-stored data including the temperature state detected at the current time point and the current time point may be referred to as a time difference of detection.

When the time difference of detection is greater than or equal to the first threshold value, the processing device 218 makes determination of "Yes" and the flow proceeds to step S208 of FIG. 11. The processing device 218 calculates a parameter change rate based on the DDS parameter and date/time in pre-stored data including the detected temperature state at the current time point, and the detected DDS parameter at the current time point and the current time point (step S208 of FIG. 11).

Subsequently, the processing device 218 extracts update target data from the pre-stored data that includes a different temperature state from the detected temperature state at the current time point. In this example, the update target data is the data that includes date/time with a time difference greater than or equal to the second threshold value (three months in this example) with respect to the current time point.

The processing device 218 then updates each of the extracted pieces of update target data based on the DDS parameter and date/time in the update target data, the current time point, and the calculated parameter change rate (step S209 of FIG. 11). In this example, processing device 218 updates the DDS parameter in the update target data to post-update value of DDS parameter which is calculated based on Numerical Expression 2 above, and updates the date/time in the update target data to the current time point.

The processing device 218 then updates the DDS parameter and date/time in data to the DDS parameter detected at the current time point and the current time point, respectively, the data including the temperature at the current time point and the temperature change rate at the current time point detected in step S205 (step S210 of FIG. 11). Subsequently, the processing device 218 completes the processing illustrated in FIG. 11.

It is to be noted that when the time difference of detection is smaller than the first threshold value, the processing device 218 makes determination of "No" in step S207 of FIG. 11, and the flow proceeds to step S210 without performing steps S208 and S209.

Figure 12:
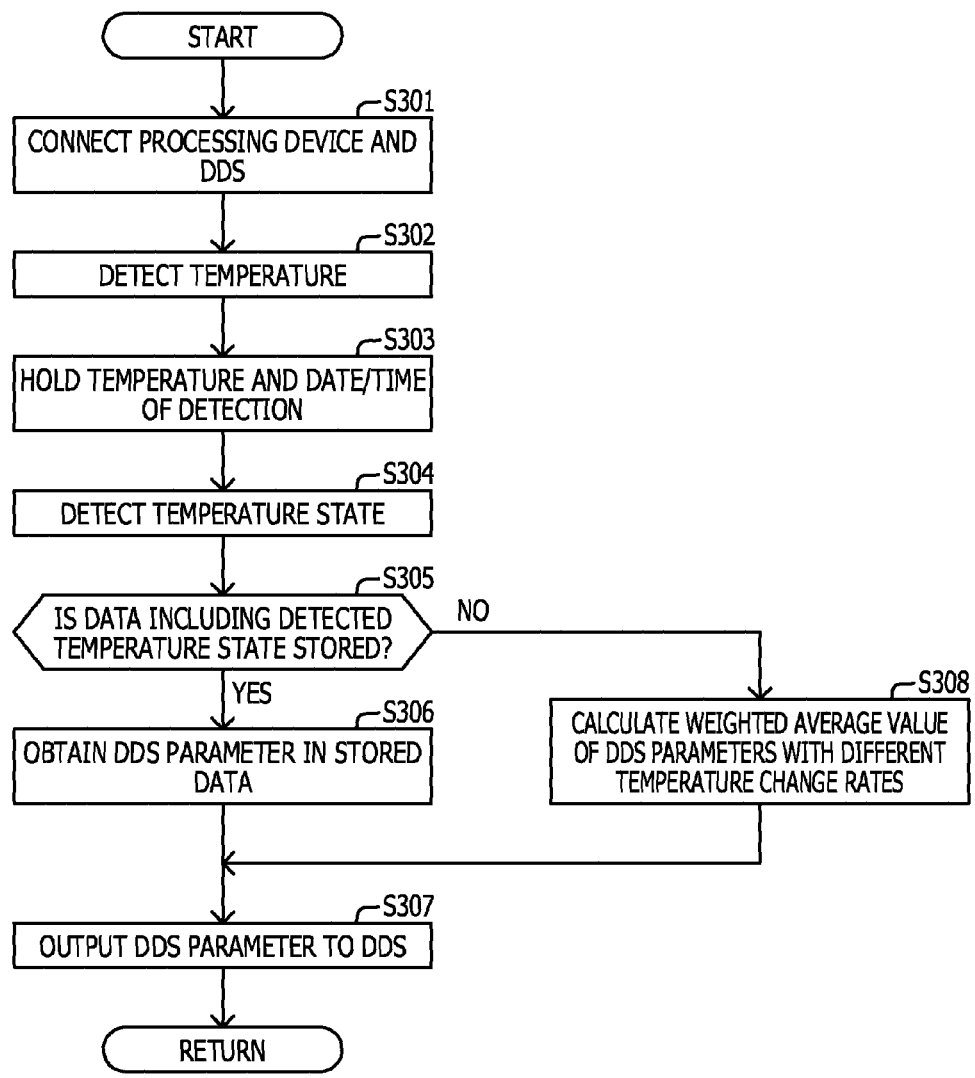
FIG. 12 is a flow chart illustrating example processing performed in holdover mode by the processing device illustrated in FIG. 3.

In this example, the processing of step S103 of FIG. 10 is the processing illustrated in FIG. 12.

In the processing illustrated in FIG. 12, the processing device 218 first controls the switch 213 to connect the processing device 218 and the DDS 215 (step S301 of FIG. 12).

Subsequently, the processing device 218 detects a temperature by the temperature sensor 217 (step S302 of FIG. 12). The processing device 218 then holds the detected temperature and the date/time of the detection in association with each other until a predetermined calculation time (one hour in this example) elapses since the detection of the temperature (step S303 of FIG. 12).

Subsequently, the processing device 218 applies the least square method to detected temperatures and the date/time of detection using a linear function, thereby obtaining the slope and intercept of an approximate straight line, the temperatures being detected in the time interval from the calculation time before the current date/time to the current date/time. The processing device 218 then detects the temperature change rate at the current date/time, that is, the obtained slope of the approximate straight line. Furthermore, based on the obtained slope and intercept of the approximate straight line, the processing device 218 detects the temperature at the current date/time, the temperature corresponding to the current date/time in the approximate straight line (step S304 of FIG. 12).

Subsequently, the processing device 218 determines whether or not data including the detected temperature state is pre-stored in the storage device 216 (step S305 of FIG. 12).

When the data including the detected temperature state at the current date/time is pre-stored in the storage device 216, the processing device 218 makes determination of "Yes" and the flow proceeds to step S306 of FIG. 12. The processing device 218 then obtains the DDS parameter in the data including the detected temperature state at the current date/time (step S306 of FIG. 12).

Subsequently, the processing device 218 outputs the obtained DDS parameter to the DDS 215 (step S307 of FIG. 12). Subsequently, the processing device 218 completes the processing illustrated in FIG. 12.

On the other hand, when the data including the detected temperature state at the current date/time is not stored in the storage device 216, the processing device 218 makes determination of "No" in step S305 and the flow proceeds to step S308 of FIG. 12. The processing device 218 then calculates a value obtained by weighted averaged of the DDS parameters in the data including the detected temperature at the current date/time and the detected temperature change rate different from the temperature change rate at the current date/time (step S308 of FIG. 12).

Subsequently, the processing device 218 outputs the calculated weighted average to the DDS 215 as the DDS parameter (step S307 of FIG. 12). Subsequently, the processing device 218 completes the processing illustrated in FIG. 12.

As described above, the clock signal generation unit 21 according to the first embodiment stores frequency correction information (the DDS parameter in this example) in the storage device 216, the frequency correction information being according to the temperature condition of the oscillating circuit 214. Furthermore, the clock signal generation unit 21 controls the frequency of a clock signal based on first and second frequency correction information in the storage device 216 according to the first temperature condition at the first and second points of time, the clock signal being generated under the second temperature condition.

According to this, even when the second temperature condition of the oscillating circuit 214 is not likely to be satisfied, change with the passage of time in the relationship between the frequency of a generated clock signal and the temperature condition of the oscillating circuit 214 may be reflected to the control of the frequency of the clock signal. Therefore, for instance, even when a reference signal is not available, the accuracy of the frequency of the clock signal may be increased.

The clock signal generation unit 21 according to the first embodiment controls the frequency of a clock signal generated under the second temperature condition, based on the first to third frequency correction information, the first to third points of time, and the current time point. The third frequency correction information is frequency correction information according to the second temperature condition at the third time point in the storage device 216.

According to this, change in the frequency correction information with the passage of time under the first temperature condition may be reflected to the control of the frequency of the clock signal under the second temperature condition. As a result, the accuracy of the frequency of the clock signal may be increased.

The clock signal generation unit 21 according to the first embodiment controls the frequency of the clock signal generated under the second temperature condition, based on the amount which is obtained by applying an adjustment amount to the correction amount indicated by the third frequency correction information. The adjustment amount increases as the difference between the first and second frequency correction information increases, also as the difference between the third time point and the current time point increases, and the adjustment amount decreases as the difference between the first and second points of time increases.

According to this, change in the frequency correction information with the passage of time under the first temperature condition may be properly reflected to the control of the frequency of the clock signal under the second temperature condition. Consequently, the accuracy of the frequency of the clock signal may be increased.

In the first embodiment, the temperature condition include a condition for at least one of the temperature and the amount of change in the temperature per unit time.

At least one of the temperature and the amount of change in the temperature per unit time has a strong correlation with the frequency of the clock signal. Therefore, with the clock signal generation unit 21, the accuracy of the frequency of the clock signal may be increased.

Figure 13:
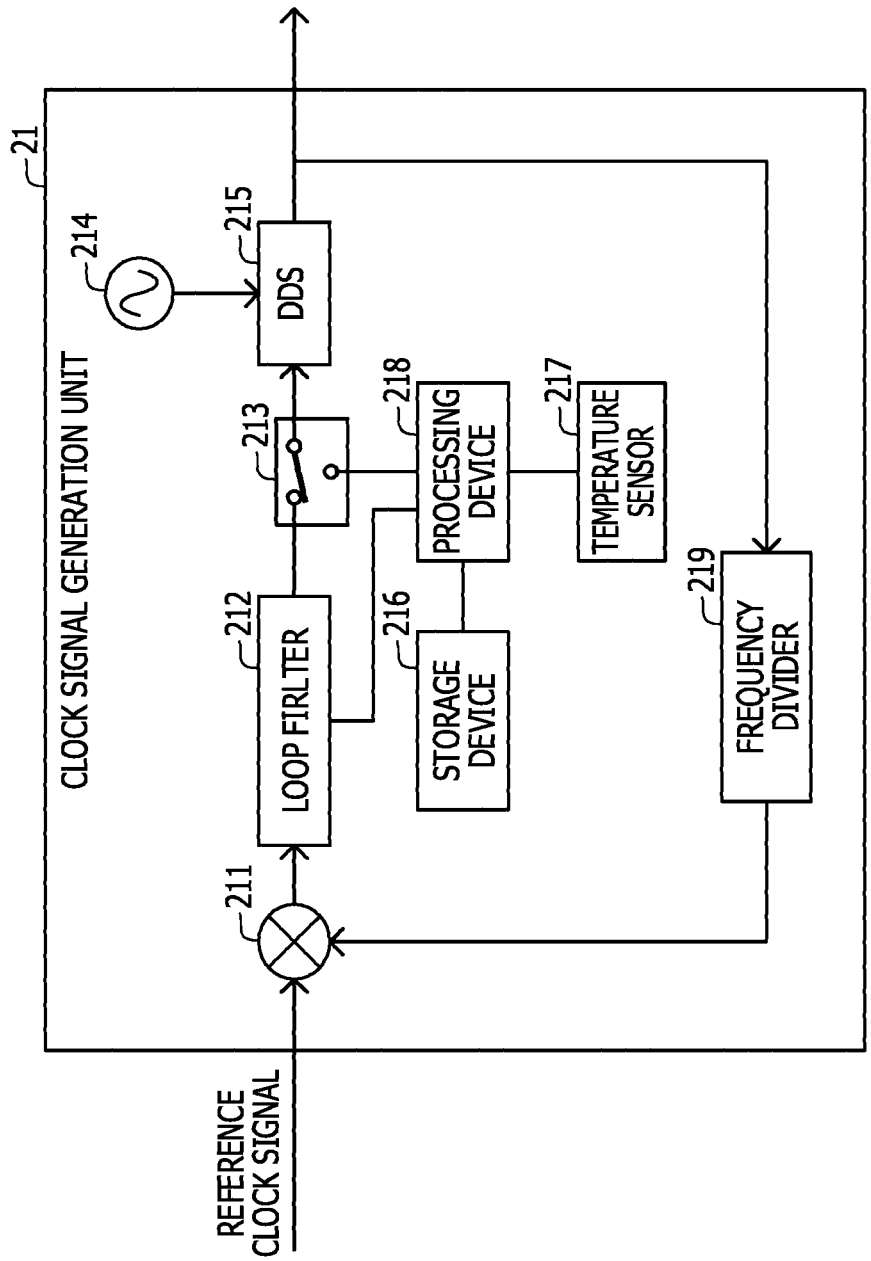
FIG. 13 is a block diagram illustrating the configuration of a clock signal generation unit according to a modification of the first embodiment.

It is to be noted that the clock signal generation unit 21 may include a frequency divider 219 as illustrated in FIG. 13. The frequency divider 219 outputs a frequency division signal with a frequency to the phase comparator 211, the frequency being obtained by dividing the frequency of the clock signal outputted from the DDS 215 by a set frequency division ratio. Thus, the frequency of the clock signal outputted from the DDS 215 is controlled at a frequency which is obtained by multiplying the frequency of the reference clock signal by a frequency division ratio.

Figure 14:
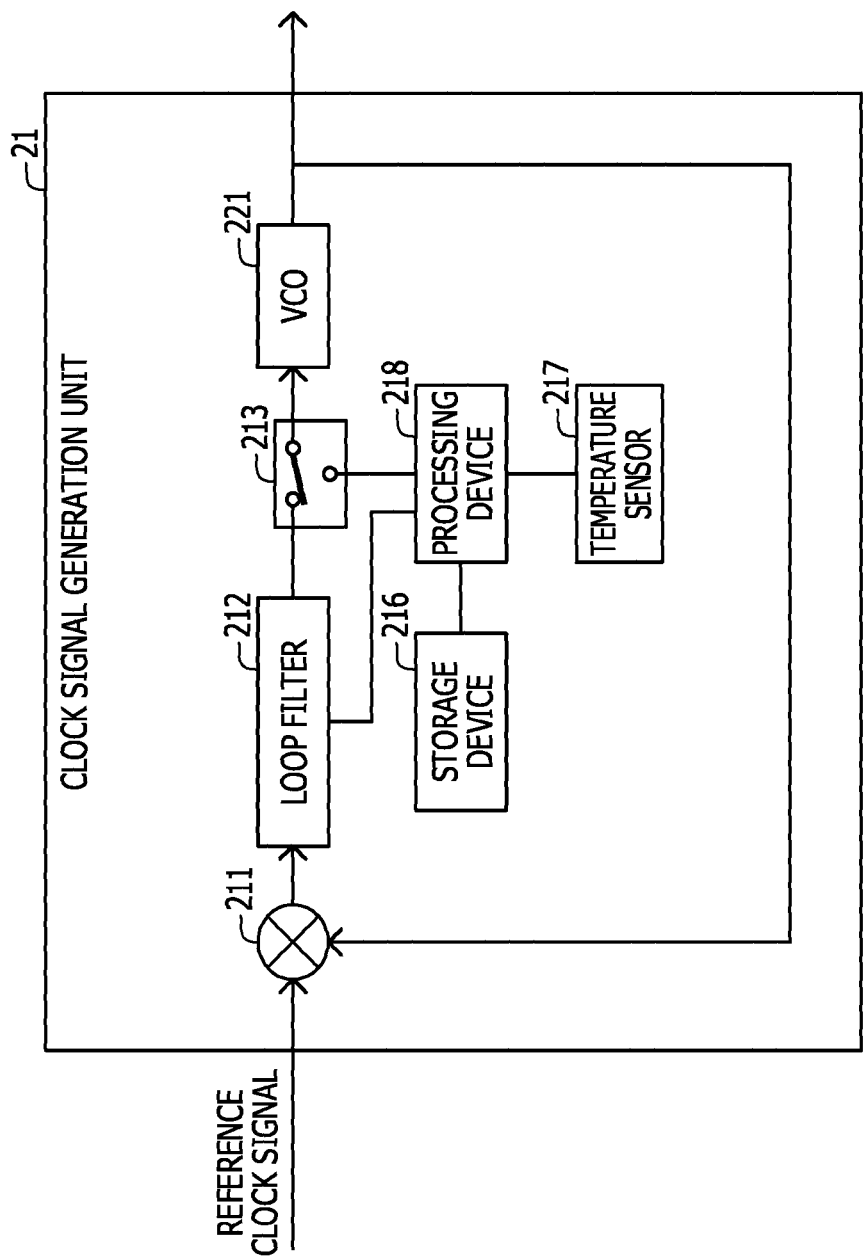
FIG. 14 is a block diagram illustrating the configuration of a clock signal generation unit according to a modification of the first embodiment.

As illustrated in FIG. 14, instead of the oscillating circuit 214 and the DDS 215, the clock signal generation unit 21 may include VCO 221. VCO is an abbreviation of Voltage Controlled Oscillator. The VCO 221 includes an oscillator that is capable of controlling the frequency of a generated clock signal according to a voltage applied. In this case, the phase comparator 211 and the processing device 218 may output a voltage signal that controls the frequency of the clock signal generated by the VCO 221.

<Second Embodiment>

Next, a wireless communication system according to a second embodiment of the present disclosure will be described. The wireless communication system according to the second embodiment differs from the wireless communication system according to the first embodiment in that a communication device estimates a DDS parameter. Hereinafter, the difference will be mainly described.

Figure 15:
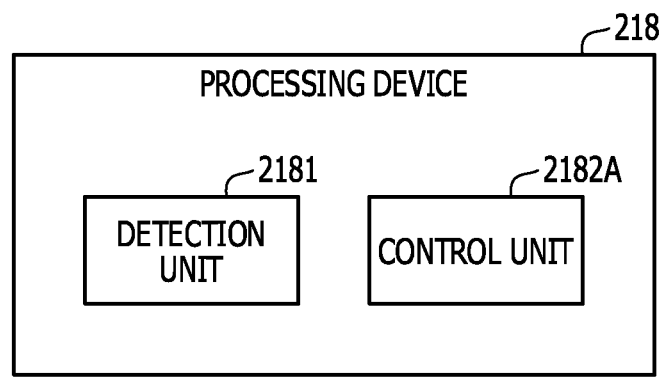
FIG. 15 is a block diagram illustrating an example function of a processing device according to a second embodiment.

As illustrated in FIG. 15, the processing device 218 of a communication device 20 according to the second embodiment functionally includes a control unit 2182A instead of the control unit 2182 of FIG. 4. The control unit 2182A has the same function as that of the control unit 2182 except for the following difference. Hereinafter, the difference will be described.

First, storage of detected DDS parameter, similarly to the first embodiment will be described.

Figure 16:
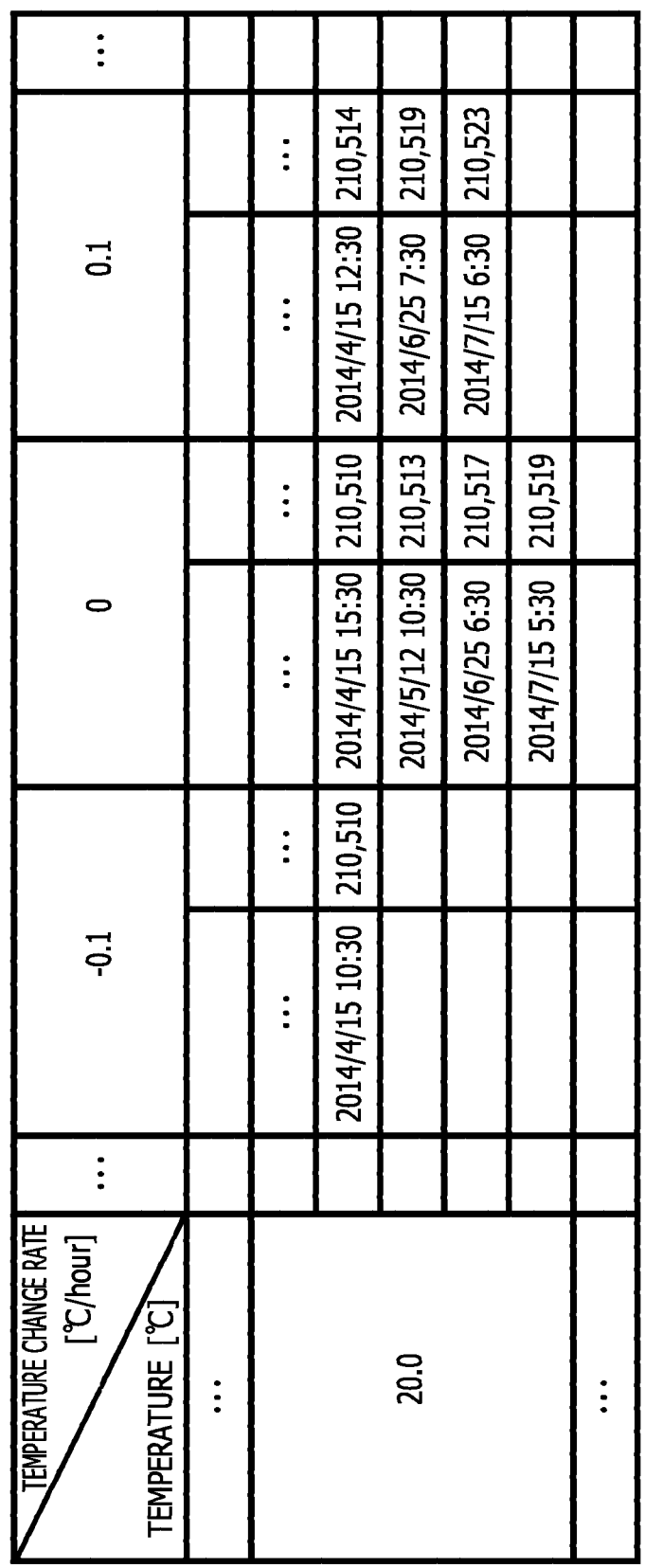
FIG. 16 is a table illustrating example data in which temperature state, DDS parameter, and date/time are associated with one another and which is to be stored in the storage device according to the second embodiment.

When data including a temperature state detected at the current time point is pre-stored in the external signal synchronous mode, the control unit 2182A newly stores the DDS parameter detected at the current time point and the current time point in the storage device 216 in association with the temperature state in the stored data. Thus, as illustrated in FIG. 16, the storage device 216 stores data in which a temperature state and one or more sets of DDS parameter and date/time are associated with each other.

Furthermore, when the time difference between the newest date/time in the data including the temperature state detected at the current time point and the current time point is greater than or equal to the first threshold value before the data storage mentioned above, the control unit 2182A adds a DDS parameter to the data including a different temperature state from the temperature state detected at the current time point. In this example, the first threshold value is three months. When the above-mentioned time difference is smaller than the first threshold value, the control unit 2182A adds no DDS parameter to the data including a different temperature state from the temperature state detected at the current time point.

Hereinafter, addition of DDS parameter to the data including a different temperature state from the temperature state detected at the current time point will be described.

The control unit 2182A calculates a parameter change rate based on the DDS parameter and date/time in the data including a temperature state detected at the current time point.

In this example, the control unit 2182A calculates a parameter change rate R based on Numerical Expression 3.

$$R=(V_5-V_4)/(t_5-t_4) \quad \text{(Numerical Expression 3)}$$

Here, $V_4$ and $t_4$ indicate a first DDS parameter and a first date/time, respectively in the data including the temperature state detected at the current time point. Here, $V_5$ and $t_5$ indicate a second DDS parameter and a second date/time, respectively in the data including the temperature state detected at the current time point. The first DDS parameter is a DDS parameter associated with the first date/time. The second DDS parameter is a DDS parameter associated with the second date/time following the first date/time.

The first date/time may be the oldest date/time in the data including the temperature state detected at the current time point. The second date/time may be the latest date/time in the data including the temperature state detected at the current time point. It is to be noted that the first date/time may be the latest date/time at or after a predetermined time before the second date/time in the data including the temperature state detected at the current time point.

It is to be noted that the control unit 2182A may apply the least square method to the DDS parameters and dates/times in the data including the temperature state detected at the current time point using a linear function, thereby obtaining the slope of an approximate straight line, that indicates the parameter change rate.

The control unit 2182A extracts target data to which DDS parameter is added, from the pre-stored data that includes a different temperature state from any temperature state in the data including the temperature state detected at the current time point. The target data to which DDS parameter is added may be referred to as target data for addition. In this example, the control unit 2182A extracts data as target data for addition, the data including date/time for which the latest date/time has a time difference greater than or equal to a fourth threshold value (for instance, three months) with respect to the current time point.

The control unit 2182A determines the DDS parameter at the current time point for each of the extracted target data for addition based on the latest DDS parameter and date/time in the target data for addition, the current time point, and the calculated parameter change rate. In this example, the control unit 2182A determines the DDS parameter at the current time point based on Numerical Expression 4.

$$V_6' = V_6 + R \cdot (t_c - t_6) \qquad \text{(Numerical Expression 4)}$$

In this example, $t_6$ and $V_6$ indicate the latest date/time in the target data for addition and the DDS parameter associated with the date/time, respectively. In this example, $V_6'$ indicates the DDS parameter at the current time point and $t_c$ indicates at the current time point.

The control unit 2182A newly stores the determined DDS parameter at the current time point and the current time point in the storage device 216 in association with the temperature state in the target data for addition.

In this example, out of data including a different temperature state from any temperature state in the data including the temperature state detected at the current time point, the control unit 2182A adds no DDS parameter to the data that includes date/time for which the time difference between the latest date/time and the current time point is smaller than the fourth threshold value.

In this manner, in addition to the data including the temperature state detected at the current time point, the control unit 2182A adds a DDS parameter to the data including a different temperature state from the temperature state detected at the current time point.

Therefore, change in the DDS parameter with the passage of time under the first temperature condition may be reflected to the data corresponding to the second temperature condition. Even when the second temperature condition is not likely to be satisfied, the DDS parameter for the second temperature condition may be corrected to an appropriate value.

Furthermore, in the holdover mode, the control unit 2182A determines a DDS parameter to be outputted to the DDS 215 similarly to the first embodiment, except for that the DDS parameter associated with the latest date/time in the data including the temperature states is used.

In addition, the control unit 2182A estimates a DDS parameter for each lapse of a predetermined estimation period (for instance, 10 days). In this example, estimation of DDS parameter is made in both the external signal synchronous mode and the holdover mode. It is to be noted that estimation of DDS parameter may be made in only one of the external signal synchronous mode and the holdover mode.

Hereinafter, estimation of DDS parameter will be described.

The control unit 2182A extracts target data to be estimated from the stored data. The target data to be estimated may be referred to as estimation target data. In this example, out of the data for which the time difference between the latest date/time and the current time point is greater than or equal to the third threshold value, the control unit 2182A extracts data as estimation target data, the data having the largest number of DDS parameters.

In this example, the third threshold value is smaller than the first threshold value. In this example, the third threshold value is one month. It is to be noted that the control unit 2182A may extract plural pieces of estimation target data. For instance, the control unit 2182A may extract all of the data for which the time difference between the latest date/time and the current time point is greater than or equal to the third threshold value.

Figure 17:
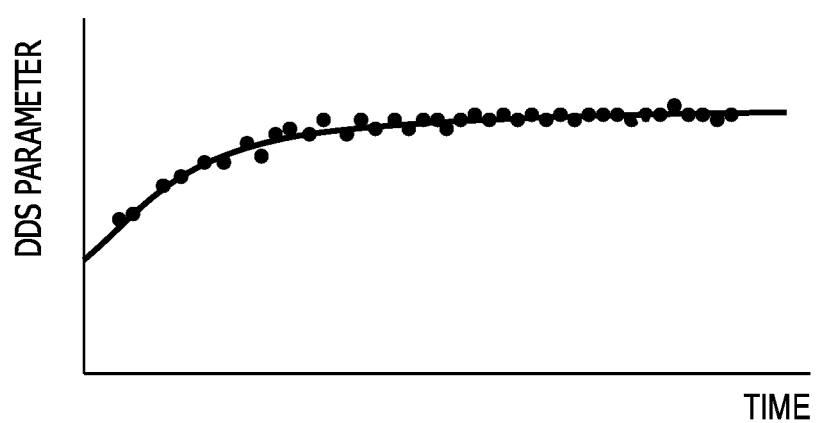
FIG. 17 is a graph illustrating an example change of DDS parameter with respect to time when the temperature remains unchanged.

Based on the DDS parameters and dates/times in the extracted estimation target data, the control unit 2182A estimates a DDS parameter to be detected at the current time point when it is assumed that the temperature state of the oscillating circuit 214 is one of the temperature states in the estimation target data in the external signal synchronous mode. When it is assumed that the temperature state of the oscillating circuit 214 is one of the temperature states in the estimation target data in the external signal synchronous mode, the DDS parameter to be detected at the current time point may be referred to as DDS parameter at the current time point. As illustrated in FIG. 17, when the temperature of the oscillating circuit 214 remains unchanged, detected DDS parameter changes with the passage of time.

Thus, in this example, the control unit 2182A applies the least square method to the DDS parameters and dates/times in the estimation target data using a predetermined approximate function, thereby identifying an approximate function. The approximate function is, for instance, a logarithmic function or a polynomial function. The control unit 2182A estimates a DDS parameter at the current time point based on the identified approximate function.

The control unit 2182A newly stores the estimated DDS parameter at the current time point and the current time point in the storage device 216 in association with the temperature state in the estimation target data.

For instance, as illustrated in FIG. 16, it is assumed that data is stored that includes 20.0° C. and −0.1° C./hour as the temperature state and 10:30 on Apr. 15, 2014 as the latest date/time. It is further assumed that data is stored that includes 20.0° C. and 0° C./hour as the temperature state and 5:30 on Jul. 15, 2014 as the latest date/time. In addition, it is assumed that data is stored that includes 20.0° C. and 0.1° C./hour as the temperature state and 6:30 on Jul. 15, 2014 as the latest date/time.

For instance, out of the data for which the time difference between the latest date/time and the current time point is greater than or equal to the third threshold value, the control unit 2182A extracts data including 20.0° C. and 0° C./hour as estimation target data, the data having the largest number of DDS parameters.

Figure 18:
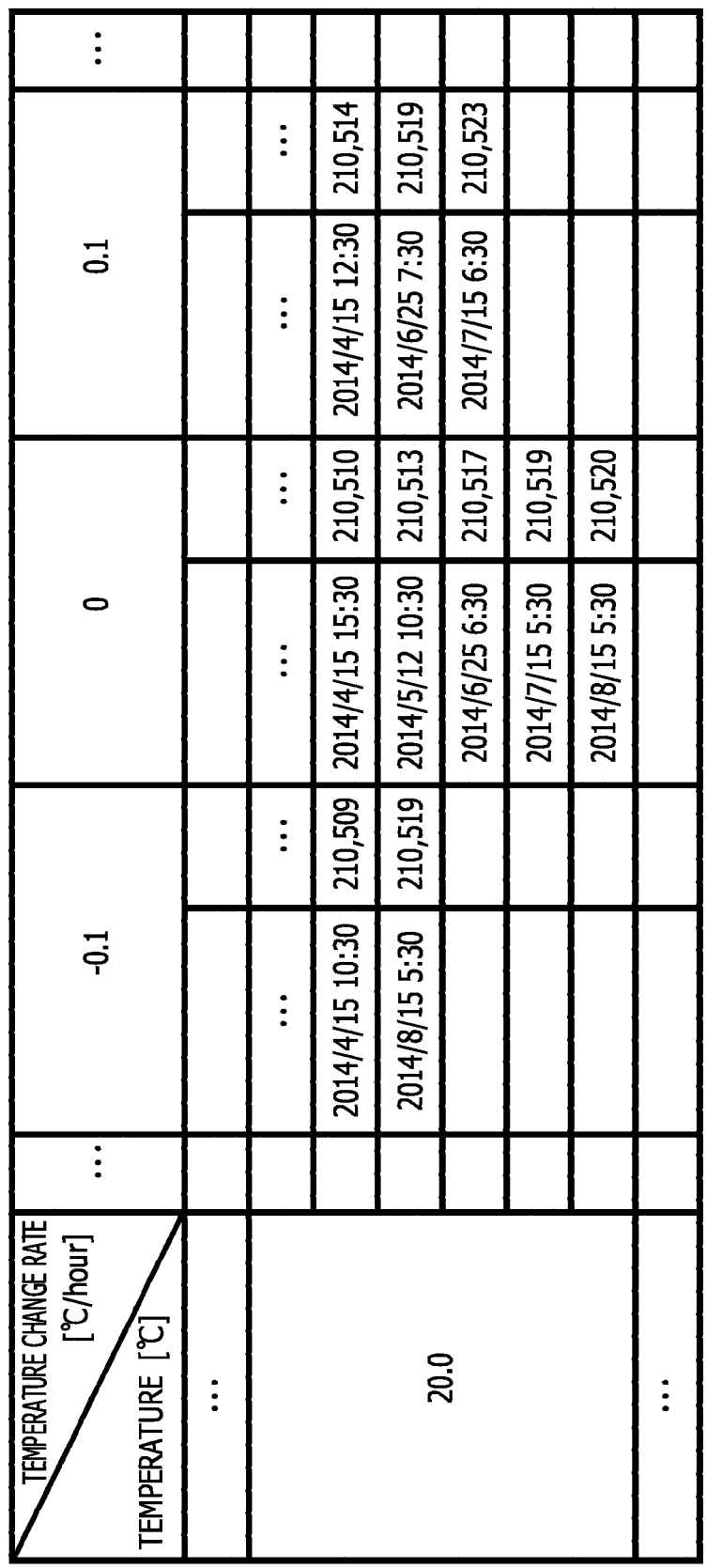
FIG. 18 is a table illustrating an example data in which temperature state, DDS parameter, and date/time are associated with one another and which is to be stored in the storage device according to the second embodiment.

The control unit 2182A then estimates a DDS parameter at the current time point based on the DDS parameters and dates/times in the estimation target data, and newly stores the estimated DDS parameter at the current time point and the current time point in the storage device 216 in association with the temperature state in the estimation target data. In this example, as illustrated in FIG. 18, the control unit 2182A stores 210,520 as the estimated DDS parameter at the current time point and 5:30 on Aug. 15, 2014 as the current time point in the storage device 216 in association with 20.0° C. and 0° C./hour.

Furthermore, when estimation of a DDS parameter is made, the control unit 2182A adds the DDS parameter to the data including a different temperature state from any temperature state in the estimation target data.

Hereinafter, addition of a DDS parameter to data will be described, the data including a different temperature state from any temperature state in the estimation target data.

The control unit 2182A calculates a parameter change rate based on the DDS parameters and dates/times in the estimation target data.

In this example, the control unit 2182A calculates the parameter change rate R based on Numerical Expression 3 above.

Here, $V_4$ and $t_4$ indicate the first DDS parameter and the first date/time, respectively in the estimation target data. Here, $V_5$ and $t_5$ indicate the second DDS parameter and the second date/time, respectively in the estimation target data.

The first date/time may be the oldest date/time in the estimation target data. Also, the second date/time may be the latest date/time in the estimation target data. It is to be noted that the first date/time may be the latest date/time at or after a predetermined time before the second date/time in the estimation target data.

It is to be noted that the control unit 2182A may apply the least square method to the DDS parameters and dates/times in the estimation target data using a linear function, thereby obtaining the slope of an approximate straight line, that indicates the parameter change rate.

The control unit 2182A extracts target data for addition from the pre-stored data that includes a different temperature state from any temperature state in the estimation target data. In this example, the control unit 2182A extracts data as target data for addition, the data including date/time for which the latest date/time has a time difference greater than or equal to a fifth threshold value (for instance, three months) with respect to the current time point. It is to be noted that the fifth threshold value may be different from the fourth threshold value.

The control unit 2182A determines the DDS parameter at the current time point for each of the extracted target data for addition based on the latest DDS parameter and date/time in the target data for addition, the current time point, and the calculated parameter change rate. In this example, the control unit 2182A determines the DDS parameter at the current time point based on Numerical Expression 4 above. The control unit 2182A newly stores the determined DDS parameter at the current time point and the current time point in the storage device 216 in association with the temperature state in the target data for addition.

In this example, out of pre-stored data including a different temperature state from any temperature state in the estimation target data, the control unit 2182A adds no DDS parameter to the data that includes date/time for which the time difference between the latest date/time and the current time point is smaller than the fifth threshold value.

For instance, when data is stored as illustrated in FIG. 16, it is assumed that data including 20.0° C. and 0° C./hour is extracted as the estimation target data. In this case, the control unit 2182A estimates a DDS parameter at the current time point based on the DDS parameters and dates/times in the estimation target data, and newly stores the estimated DDS parameter at the current time point and the current time point in the storage device 216 in association with the temperature state in the estimation target data.

Furthermore, in this example, the data is extracted that includes date/time for which the latest date/time has a time difference greater than or equal to the fifth threshold value (three months in this example) with respect to the current time point, and thus the control unit 2182A extracts the data including 20.0° C. and −0.1° C./hour as the target data for addition.

In this example, based on Numerical Expression 4 above, the control unit 2182A determines the DDS parameter at the current time point to be 210,520 for the target data for addition including 20.0° C. and −0.1° C./hour. As illustrated in FIG. 18, the control unit 2182A stores 210,520 as the determined DDS parameter at the current time point and 5:30 on Aug. 15, 2014 as the current time point in the storage device 216 in association with 20.0° C. and −0.1° C./hour.

In this manner, in addition to the estimation target data, the control unit 2182A adds a DDS parameter to the data that includes a different temperature state from any temperature state in the estimation target data.

Therefore, change in the DDS parameter with the passage of time under the first temperature condition may be reflected to the data corresponding to the second temperature condition. Even when the second temperature condition is not likely to be satisfied, the DDS parameter for the second temperature condition may be corrected to an appropriate value.

As described above, the clock signal generation unit 21 according to the second embodiment provides the same operation and effect as those of the clock signal generation unit 21 according to the first embodiment.

Furthermore, in the external signal synchronous mode, the clock signal generation unit 21 according to the second embodiment estimates the frequency correction information (DDS parameter in this example) at the current time point under the assumption that a clock signal is generated based on a reference signal under the first temperature condition. Estimation of frequency correction information is made based on the first and second frequency correction information at the first and second points in time according to the first temperature condition, and the first and second points in time. Furthermore, in the holdover mode, the clock signal generation unit 21 controls the frequency of the clock signal generated under the second temperature condition, based on the estimated frequency correction information.

According to this, change in the frequency correction information with the passage of time under the first temperature condition may be properly reflected to the control of the frequency of the clock signal under the second temperature condition. Consequently, the accuracy of the frequency of the clock signal may be increased.

In the second embodiment, the control unit 2182A adds a DDS parameter to the stored data. It is to be noted that in the holdover mode, without adding a DDS parameter to the stored data, the control unit 2182A may determine a DDS parameter similarly to the case of adding a DDS parameter. In this case, the control unit 2182A may determine a DDS parameter to be outputted to the DDS 215 based on the determined DDS parameter.

Figure 19:
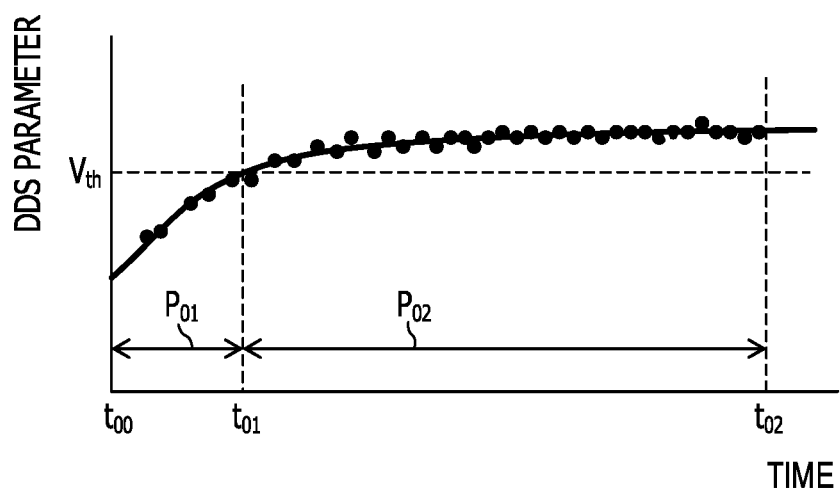
FIG. 19 is a graph illustrating an example change of DDS parameter with respect to time when the temperature remains unchanged.

As illustrated in FIG. 19, it is assumed that the clock signal generation unit 21 starts an operation at time $t_{00}$ and time $t_{02}$ has come while the temperature of the oscillating circuit 214 remains unchanged. In this case, for instance, detected DDS parameter varies as illustrated in FIG. 19. In this example, the DDS parameter exceeds value $V_{th}$ at time $t_{01}$.

As illustrated in FIG. 19, the amount of change in the DDS parameter is greater in period $P_{01}$ than in period $P_{02}$, the period $P_{01}$ in which the DDS parameter is smaller than value $V_{th}$, the period $P_{02}$ in which the DDS parameter is greater than value $V_{th}$. In other words, the smaller the DDS parameter, the larger the change with the passage of time in the relationship between the frequency of the clock signal and the temperature condition of the oscillating circuit 214.

Thus, in a modification of the control unit 2182A, when a DDS parameter detected at the current time point is smaller than a predetermined threshold value $V_{th}$, the detected DDS parameter is stopped or prohibited from being stored in the storage device 216. The threshold value $V_{th}$ may vary with temperature conditions.

Therefore, in the modification of the control unit 2182A, the frequency of the clock signal may be corrected based on the detected DDS parameter in the period $P_{02}$ in which change with the passage of time is unlikely to occur in the relationship between the frequency of the clock signal and the temperature condition of the oscillating circuit 214. Consequently, the accuracy of the frequency of the clock signal may be increased.

Figure 20:
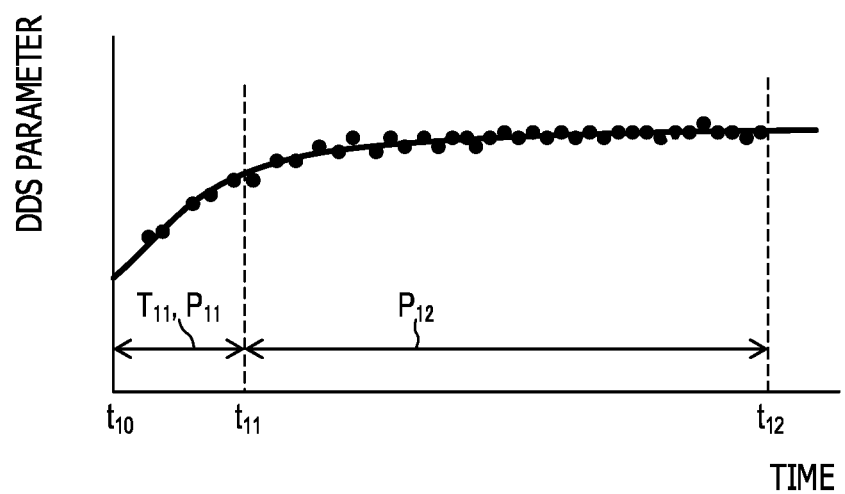
FIG. 20 is a graph illustrating an example change of DDS parameter with respect to time when the temperature remains unchanged.

As illustrated in FIG. 20, it is assumed that the clock signal generation unit 21 starts an operation at time $t_{10}$ and time $t_{12}$ has come while the temperature of the oscillating circuit 214 remains unchanged. In this case, for instance, detected DDS parameter varies as illustrated in FIG. 20.

As illustrated in FIG. 20, the amount of change in the DDS parameter is greater in period $P_{11}$ from date/time $t_{10}$ to date/time $t_{11}$ than in period $P_{12}$ from date/time $t_{11}$ to date/time $t_{12}$. The date/time $t_{11}$ is the time at which a predetermined time $T_{11}$ has elapsed since the start of the operation of the clock signal generation unit 21. In other words, the shorter the elapsed time since the start of the operation of the clock signal generation unit 21, the larger the change with the passage of time in the relationship between the frequency of the clock signal and the temperature condition of the oscillating circuit 214.

Thus, in the modification of the control unit 2182A, the detected DDS parameter is stopped or prohibited from being stored in the storage device 216 until a predetermined time $T_{11}$ elapses since the start of the operation of the clock signal generation unit 21. The time $T_{11}$ may vary with temperature conditions.

Therefore, in the modification of the control unit 2182A, the frequency of the clock signal may be corrected based on the detected DDS parameter in the period $P_{12}$ in which change with the passage of time is unlikely to occur in the relationship between the frequency of the clock signal and the temperature condition of the oscillating circuit 214. Consequently, the accuracy of the frequency of the clock signal may be increased.

Figure 21:
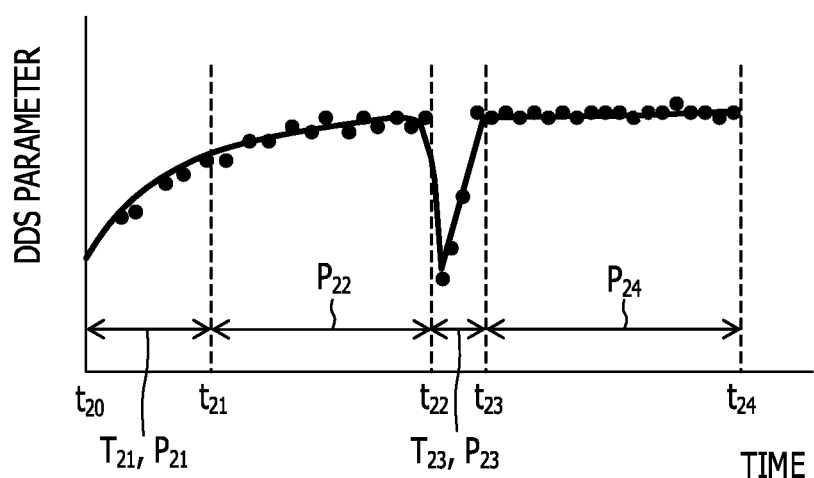
FIG. 21 is a graph illustrating an example change of DDS parameter with respect to time when the temperature remains unchanged.

As illustrated in FIG. 21, it is assumed that the clock signal generation unit 21 starts an operation at time $t_{20}$ and time $t_{24}$ has come while the temperature of the oscillating circuit 214 remains unchanged. Furthermore, it is assumed that the clock signal generation unit 21 stops the operation and resumes the operation at date/time $t_{22}$. In this case, for instance, detected DDS parameter varies as illustrated in FIG. 21.

As illustrated in FIG. 21, the amount of change in the DDS parameter is greater in period $P_{21}$ from date/time $t_{20}$ to date/time $t_{21}$ than in period $P_{22}$ from date/time $t_{21}$ to date/time $t_{22}$. The date/time $t_{21}$ is the time at which a predetermined time $T_{21}$ has elapsed since the start of the operation of the clock signal generation unit 21. In other words, the shorter the elapsed time since the start of the operation of the clock signal generation unit 21, the larger the change with the passage of time in the relationship between the frequency of the clock signal and the temperature condition of the oscillating circuit 214.

Furthermore, as illustrated in FIG. 21, the amount of change in the DDS parameter is greater in period $P_{23}$ from date/time $t_{22}$ to date/time $t_{23}$ than in period $P_{24}$ from date/time $t_{23}$ to date/time $t_{24}$. The date/time $t_{23}$ is the time at which a predetermined time $T_{23}$ has elapsed since the stop of the operation of the clock signal generation unit 21. In other words, the shorter the elapsed time since the stop of the operation of the clock signal generation unit 21, the larger the change with the passage of time in the relationship between the frequency of the clock signal and the temperature condition of the oscillating circuit 214.

Thus, in the modification of the control unit 2182A, the detected DDS parameter is stopped or prohibited from being stored in the storage device 216 until a predetermined time $T_{21}$ elapses since the start of the operation of the clock signal generation unit 21. The time $T_{21}$ may vary with temperature conditions. Furthermore, in the modification of the control unit 2182A, the detected DDS parameter is stopped or prohibited from being stored in the storage device 216 until a predetermined time $T_{23}$ elapses since the stop of the operation of the clock signal generation unit 21. The time $T_{23}$ may vary with temperature conditions.

Therefore, in the modification of the control unit 2182A, the frequency of the clock signal may be corrected based on the detected DDS parameter in the period $P_{22}$ and the period $P_{24}$ in which change with the passage of time is unlikely to occur in the relationship between the frequency of the clock signal and the temperature condition of the oscillating circuit 214. Consequently, the accuracy of the frequency of the clock signal may be increased.

In the embodiments described above, the reference signal is a signal that is transmitted from the master device 10 to the communication device 20. It is to be noted that the reference signal may be a signal that is transmitted from a satellite in a global navigation satellite system (GNSS). GNSS is an abbreviation of Global Navigation Satellite System. An example of GNSS is global positioning system (GPS).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A control device for a clock generation circuit that generates a clock signal based on a reference signal from an outside, the control device comprising:
   a storage device that stores frequency correction information for the clock signal according to a temperature condition of the clock generation circuit; and
   a processor that controls a frequency of the clock signal generated by the clock generation circuit under a second temperature condition, based on first and second frequency correction information according to a first temperature condition at first and second time points in the storage device,
   wherein the processor controls the frequency of the clock signal generated by the clock generation circuit under the second temperature condition, based on third frequency correction information according to the second temperature condition at a third time point, the first and second frequency correction information, the first to third time points, and a current time point in the storage device.

2. The control device for a clock generation circuit according to claim 1, wherein the processor further controls the frequency of the clock signal generated by the clock generation circuit under the second temperature condition, based on an amount obtained by correcting a correction amount indicated by the third frequency correction information by using an amount that increases as a difference between the first frequency correction information and the second frequency correction information increases, increases as a difference between the third time point and the current time point increases, and decreases as a difference between the first time point and the second time point increases.

3. The control device for a clock generation circuit according to claim 1,
wherein the processor estimates frequency correction information at the current time point based on the first and second frequency correction information and the first and second time points under an assumption that the clock generation circuit generates the clock signal based on the reference signal under the first temperature condition, and the processor controls the frequency of the clock signal generated by the clock generation circuit under the second temperature condition, based on the estimated frequency correction information.

4. The control device for a clock generation circuit according to claim 1,
wherein when a difference between the third time point and the current time point is smaller than a predetermined threshold value, the processor corrects the frequency of the clock signal generated by the clock generation circuit under the second temperature condition, by a correction amount indicated by the third frequency correction information.

5. The control device for a clock generation circuit according to claim 1,
wherein when a difference between the first time point and the second time point is smaller than a predetermined threshold value, the processor corrects the frequency of the clock signal generated by the clock generation circuit under the second temperature condition, by a correction amount indicated by the third frequency correction information.

6. The control device for a clock generation circuit according to claim 1,
wherein when a difference between the first frequency correction information and the second frequency correction information is smaller than a predetermined threshold value, the processor corrects the frequency of the clock signal generated by the clock generation circuit under the second temperature condition, by a correction amount indicated by the third frequency correction information.

7. The control device for a clock generation circuit according to claim 1,
wherein the processor updates frequency correction information according to the second temperature condition in the storage device based on the first and second frequency correction information, and
controls the frequency of the clock signal generated by the clock generation circuit under the second temperature condition, based on the frequency correction information according to the second temperature condition in the storage device.

8. The control device for a clock generation circuit according to claim 7, wherein when frequency correction information is smaller than a predetermined threshold value, the storage device does not store the frequency correction information.

9. The control device for a clock generation circuit according to claim 7,
wherein the storage device stores no frequency correction information in a time period from start of an operation of the clock generation circuit until a predetermined time elapses.

10. The control device for a clock generation circuit according to claim 7,
wherein the storage device stores no frequency correction information in a time period from stop of an operation of the clock generation circuit until a predetermined time elapses.

11. The control device for a clock generation circuit according to claim 1,
wherein the processor controls the frequency of the clock signal generated by the clock generation circuit under the second temperature condition, based on the first and second frequency correction information and frequency correction information according to the second temperature condition in the storage device.

12. The control device for a clock generation circuit according to claim 1,
wherein the temperature condition includes a condition for at least one of temperature and an amount of change in temperature per unit time.

13. A method of controlling a clock generation circuit that generates a clock signal based on a reference signal from an outside, the method comprising:
storing frequency correction information of the clock signal in a storage device, the frequency correction information being according to a temperature condition for the clock generation circuit; and
controlling a frequency of the clock signal generated by the clock generation circuit under a second temperature condition, based on first and second frequency correction information according to a first temperature condition at first and second time points in the storage device,
wherein the controlling of the frequency is performed based on third frequency correction information according to the second temperature condition at a third time point, the first and second frequency correction information, the first to third time points, and a current time point in the storage device.

14. A clock generation circuit comprising:
a generation unit that generates a clock signal based on a reference signal from an outside;
a storage device that stores frequency correction information for the clock signal according to a temperature condition of the generation unit; and
a processor that controls a frequency of the clock signal generated by the generation unit under a second temperature condition, based on first and second frequency correction information according to a first temperature condition at first and second time points in the storage device,
wherein the processor controls a frequency of the clock signal generated by the generation unit under the second temperature condition, based on third frequency correction information according to the second temperature condition at a third time point, the first and second frequency correction information, the first to third time points, and a current time point in the storage device.

* * * * *